(12) United States Patent
Field et al.

(10) Patent No.: US 6,392,750 B1
(45) Date of Patent: May 21, 2002

(54) USE OF SCATTERED AND/OR TRANSMITTED LIGHT IN DETERMINING CHARACTERISTICS, INCLUDING DIMENSIONAL INFORMATION, OF OBJECT SUCH AS PART OF FLAT-PANEL DISPLAY

(75) Inventors: John E. Field, Dorrington; Donald J. Elloway, Campbell; Chungdee Pong, Cupertino, all of CA (US)

(73) Assignee: Candescent Technologies Corporation, San Jose, CA (US)

( * ) Notice: Subject to any disclaimer, the term of this patent is extended or adjusted under 35 U.S.C. 154(b) by 0 days.

(21) Appl. No.: 09/387,632

(22) Filed: Aug. 31, 1999

(51) Int. Cl.$^7$ ............................................... G01N 21/47
(52) U.S. Cl. ........................................................ 356/445
(58) Field of Search ................................. 356/445, 363; 354/15, 1, 3, 12; 430/1, 2, 313, 319

(56) References Cited

U.S. PATENT DOCUMENTS

| | | | |
|---|---|---|---|
| 5,559,389 A | 9/1996 | Spindt et al. | 313/310 |
| 5,564,959 A | 10/1996 | Spindt et al. | 445/24 |
| 5,626,991 A * | 5/1997 | Hugle | 356/363 |
| 5,766,446 A | 6/1998 | Spindt et al. | 205/640 |
| 5,893,967 A | 4/1999 | Knall et al. | 205/640 |
| 5,920,151 A | 7/1999 | Barton et al. | 313/497 |

OTHER PUBLICATIONS

Halliday et al, *Physics for Students of Science and Engineering*, Part II (2d ed., John Wiley & Sons, Inc.), 1963, pp. 976–982 and 1007–1028.

Jackson, *Classical Electrodynamics* (2d ed., John Wiley & Sons, Inc.), 1975, pp. 405–418, 427–432, and 441–452.

* cited by examiner

*Primary Examiner*—Frank G. Font
*Assistant Examiner*—Michael P. Stafira
(74) *Attorney, Agent, or Firm*—Skjerven Morrill MacPherson LLP; Ronald J. Meetin

(57) ABSTRACT

Scattered or/and transmitted light is employed to determine characteristics, including dimensional information, of an object (60) such as part (10) of a flat-panel display. The dimensional information includes the average diameter of openings (62) in the object, the average density of the openings, and the average thickness of a layer (64) of the object. Light-diffraction patterns are produced to determine characteristics, such as abnormalities (146 and 148), of crossing lines (140 and 142) in such an object.

74 Claims, 9 Drawing Sheets

USE OF SCATTERED AND/OR TRANSMITTED LIGHT IN DETERMINING CHARACTERISTICS, INCLUDING DIMENSIONAL INFORMATION, OF OBJECT SUCH AS PART OF FLAT-PANEL DISPLAY

FIELD OF USE

This invention relates to the use of light in determining the characteristics of objects, especially dimensional information about relatively small features in flat-panel cathode-ray tube ("CRT") displays.

BACKGROUND

A flat-panel CRT display is typically formed with an electron-emitting device and a light-emitting device situated opposite the electron-emitting device. In a flat-panel CRT display of the gated field-emission type ("field-emission display"), the electron-emitting device contains a baseplate, a lower level of emitter electrodes overlying the baseplate's interior surface, a dielectric layer overlying the emitter electrodes, and an upper level of control (or gate) electrodes extending over the dielectric layer. Electron-emissive elements are situated in openings in the dielectric layer and are exposed through openings in the control electrodes.

The light-emitting device in a field-emission display ("FED") contains a transparent faceplate, an anode that overlies the faceplate's interior surface, and an array of light-emitting regions also overlying the faceplate's interior surface. During operation of the FED, electrons are emitting from selected electron-emissive elements and are attracted by the anode to the light-emitting device. Upon reaching the light-emitting device, the electrons strike corresponding light-emissive regions and cause them to emit light that produces an image on the faceplate's exterior surface.

For a flat-panel display to operate properly and provide a distinct image, the dimensions in certain parts of the display need to be controlled carefully. Controlling these dimensions typically entails measuring their values. It is often desirable that measurement be performed as the display portion having the dimensions is being fabricated.

In some cases, the dimensions that need to be measured carefully are quite small. For example, in an FED, the diameters of the openings that contain the electron-emissive elements are commonly on the order of 0.1 $\mu$m. Due to the small diameter value, highly sophisticated equipment such as a scanning electron microscope or an atomic force microscope is conventionally employed to measure the opening diameters. A relatively large amount of time is typically needed for setting up the equipment to make the measurements, including replacement of worn-out components such as measurement tips, and for subsequently analyzing the accumulated data. It is difficult to perform measurement with such equipment as the openings are being created.

Furthermore, the scanning electron microscope and atomic force microscope each often have a relatively small amount of chamber volume for receiving a specimen that is to be examined. To perform a measurement, a good specimen must commonly be broken into pieces small enough to be placed in the chamber volume. It is desirable to have a simple non-intrusive analytical technique and system for measuring small dimensions, such as the diameters of small openings, in objects such as components of flat-panel displays. It is also desirable that the analytical technique and system be of such a nature that the measurement can be made during the fabrication of the feature having the dimensions being measured.

GENERAL DISCLOSURE OF THE INVENTION

The present invention furnishes a group of analytical techniques and systems in which scattered and/or transmitted light is employed in determining certain characteristics of objects such as partially or completely fabricated components of flat-panel displays. The characteristics include the average diameters of openings in the objects.

The openings can be quite small. The average opening diameter is typically less than the wavelength of the scattered and/or transmitted light utilized in determining, i.e., measuring, the opening diameter. The scattered and/or transmitted light typically includes visible light. Inasmuch as visible light ranges in wavelength from approximately 0.4 $\mu$m to approximately 0.7 $\mu$m, the present light-scattering or light-transmission technique can be utilized to measure opening diameters of less than 0.4 $\mu$m. An average opening diameter in the vicinity of 0.1 $\mu$m or less can readily be measured in accordance with the invention. Also, the diameter measurement can be performed as the openings are being created. The present analytical techniques and systems are thus highly beneficial.

More particularly, in accordance with one aspect of the invention, light which scatters as it propagates into openings in an object is collected to produce a light-collection signal representative of the intensity of the scattered light. The scattered light includes light which undergoes diffraction in propagating into the openings in the object. The scattered light may be concentrated at one or more wavelengths or may be distributed across a wavelength band. In either case, the scattered light used to produce the light-collection signal is of wavelength greater than or equal to a principal wavelength value. The average diameter of the openings is less than the principal wavelength value, preferably less than one half the principal wavelength value. Hence, the scattered light used to produce the light-collection signal is of wavelength greater than, or equal to, the average opening diameter. The light-collection signal for the scattered light is evaluated to determine dimensional information about the openings. The dimensional information typically includes the average opening diameter.

In accordance with another aspect of the invention, light transmitted through openings in an object is collected to produce a light-collection signal representative of the intensity of the transmitted light. The transmitted light used to produce the light-collection signal has the same wavelength characteristics relative to the openings as the scattered light utilized in the first-mentioned aspect of the invention. That is, the transmitted light used to produce the light-collection signal is of wavelength greater than, or equal to, the average diameter of the openings. The light-collection signal for the transmitted light is evaluated to determine dimensional information about the openings. Once again, the dimensional information typically includes the average opening diameter.

In the first-mentioned aspect of the invention, additional light whose wavelength is too small to be employed in producing the light-collection signal is typically scattered in propagating into the openings. Similarly, additional light whose wavelength is too small to be employed in producing the light-collection signal is typically transmitted through the openings in the second-mentioned aspect of the invention. For simplicity, the additional (unused) scattered and transmitted light is not mentioned further in this general disclosure of the invention.

An analytical system that implements the light-scattering or light-transmission technique of the invention contains a light-emitting structure, a light-collecting structure, and a processor. The light-emitting structure provides light which is transmitted through the openings or/and undergoes scattering in being propagated into the openings. The light-collecting structure collects the transmitted or scattered light, and provides the light-collection signal. The processor evaluates the light-collection signal to determine the desired dimensional information.

The principles of the invention can be applied in various ways to determine dimensional information other than the average diameter of the openings. For example, when the openings extend through a layer of the object, both scattered and transmitted light having the above-described wavelength characteristics relative to the average opening diameter can be collected to produce light-collection signals respectively representative of the intensities of the scattered and transmitted light. The light-collection signals are then evaluated, typically by a comparison procedure, to determine the average thickness of the layer. An analytical system that determines the average layer thickness contains a light-emitting structure, a light-collecting structure, and a processor operable generally in the manner described above except that the resulting dimensional information is the average layer thickness.

In accordance with a further aspect of the invention, light is directed towards an object, such as part of a flat-panel display, having a group of generally parallel first lines and a group of generally parallel second lines that cross the first lines. Light is diffracted off the first lines to produce a diffraction pattern characteristic of the first lines. Light is similarly diffracted off the second lines to produce a diffraction pattern characteristic of the second lines. The diffraction patterns are examined to determine certain characteristics of the lines. As an example, when an abnormality, such as a defect, occurs in one or both of the groups of lines, each group of lines having the abnormality can be determined by comparing the diffraction patterns.

The present techniques and systems for determining characteristics of objects are quite simple. Little time is needed for equipment setup. The systems of the invention normally perform the necessary data analysis automatically. The present analytical techniques are non-intrusive. There is typically no need to break up a good specimen, especially when the specimen is a component of a flat-panel display, into smaller pieces or to otherwise damage a specimen in order to determine the specimen's characteristics which are determinable in accordance with the invention. The characteristics can normally be determined across the entire specimen without damaging it.

The analytical techniques of the invention can be performed during the fabrication of the feature that is to be analyzed according to the invention. The measurement accuracy achieved with the present analytical systems is typically better than that achieved with electron microscopes. Consequently, the invention provides a large advance over the prior art.

BRIEF DESCRIPTION OF THE DRAWINGS

Like reference symbols are employed in the drawings and in the description of the preferred embodiments to represent the same, or very similar, item or items.

DESCRIPTION OF THE PREFERRED EMBODIMENTS

General Considerations

Various optical-based measurement techniques are utilized in the present invention to facilitate manufacturing products such as flat-panel CRT displays. Electron emission in a flat-panel CRT display fabricated with the assistance of the invention typically occurs according to field-emission principles. Such a field-emission display can serve as a flat-panel television or a flat-panel video monitor for a personal computer, a lap-top computer, or a workstation.

In the following description, the term "electrically insulating" (or "dielectric") generally applies to materials having a resistivity greater than $10^{12}$ ohm-cm. The term "electrically non-insulating" thus refers to materials having a resistivity less than or equal to $10^{12}$ ohm-cm. Electrically non-insulating materials are divided into (a) electrically conductive materials for which the resistivity is less than 1 ohm-cm and (b) electrically resistive materials for which the resistivity is in the range of 1 ohm-cm to $10^{12}$ ohm-cm. Similarly, the term "electrically non-conductive" refers to materials having a resistivity of at least 1 ohm-cm, and includes electrically resistive and electrically insulating materials. These categories are determined at an electric field of no more than 10 volts/$\mu$m.

The term "wavelength" is sometimes used here in the singular sense in connection with a wavelength (or frequency) range. When so used, "wavelength" means the wavelengths of the waves of the radiation, e.g., light, in the wavelength range. Also, "wavelength" is the wavelength in a vacuum or, to a close approximation, in air.

A body, such as a layer of material, is referred to herein as being "transparent" when the body transmits a substantial percentage of light incident on the body. In particular, a "transparent" body typically transmits at least 10%, preferably at least 90%, of incident visible light. The body may also transmit at least 10%, preferably at least 90%, of incident ultraviolet ("UV") or/and infrared ("IR") light, at least in one or more parts of the UV or/and IR wavelength regimes. IR transmission typically cuts off when the wavelength is above a certain value, e.g., 3–5 $\mu$m for the case in which the body is an electron-emitting or light-emitting device of the flat-panel CRT display described below. Material such as indium tin oxide can be used to implement transparent electrodes or other transparent electrically non-insulating elements.

Configuration and Fabrication of Field-emission Display

Figure 1:
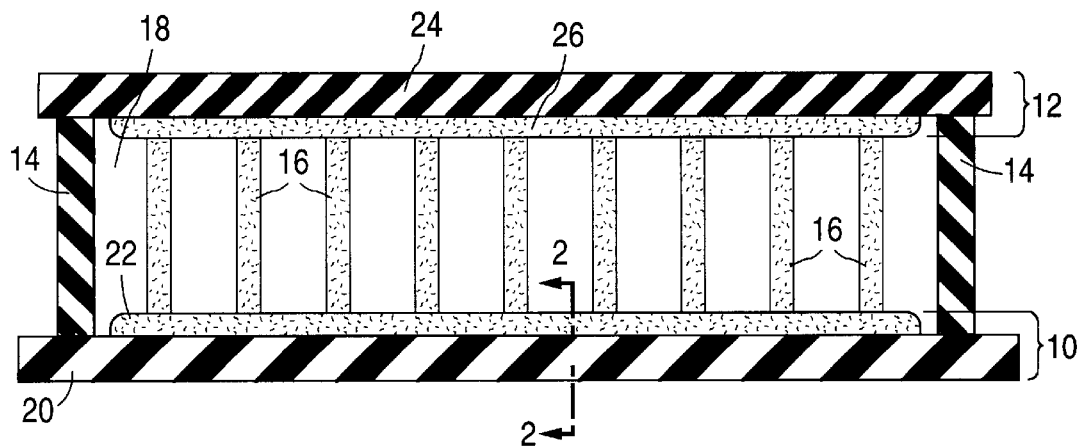
FIG. 1 is a cross-sectional side view of a flat-panel CRT display whose manufacture can be assisted using the analytical techniques of the invention.

FIG. 1 generally illustrates a field-emission display (again, "FED") fabricated according to the invention. The principal components of the FED of FIGS. 1 and 2 are a field-emission electron-emitting device (or field emitter) 10, a light-emitting device 12, an annular outer wall 14, and a group of generally parallel spacer walls 16. Field emitter 10 and light-emitting device 12 are connected together through outer wall 14 to form a sealed enclosure 18 maintained at a high vacuum, typically $10^{-5}$ torr or less. Spacer walls 16 are situated inside enclosure 18 between devices 10 and 12.

Field emitter 10 consists of a generally flat electrically insulating baseplate 20 and a group of patterned layers 22 overlying the interior surface of baseplate 20. Light-emitting device 12 consists of a generally flat transparent faceplate 24 and a group of patterned layers 26 overlying the interior surface of faceplate 24. Baseplate 20 and faceplate 24 extend largely parallel to each other.

Patterned layers 22 in field emitter 10 include a two-dimensional array of sets of field-emission electron-emissive elements (not shown in FIG. 1) which selectively emit electrons that pass through the open regions between spacer walls 16. The electrons emitted by each different set of electron-emissive elements are controlled (focused) so as to generally follow trajectories that terminate at a corresponding light-emissive element in a two-dimensional array of light-emissive elements (also not shown in FIG. 1) provided in patterned layers 26 of light-emitting device 12. Upon being struck by the impinging electrons, the light-emissive elements emit light that produce an image on the exterior (viewing) surface of faceplate 24.

FIGS. 2a–2f (collectively "FIG. 2") illustrate how field emitter 10 of the FED of FIG. 1 is manufactured according to a process in which one or more of the analytical techniques of the invention are employed to facilitate FED manufacture. The starting point for the process of FIG. 2 is baseplate 20. See FIG. 2a. Baseplate 20 is normally transparent.

A lower electrically non-insulating region 30 lies on baseplate 20. Lower non-insulating region 30 consists of a patterned electrically conductive emitter-electrode layer and an overlying electrically resistive layer, neither of which is specifically shown in FIG. 2. The emitter-electrode layer is formed with a group of laterally separated generally parallel emitter electrodes. To the extent that any of the present analytical techniques utilizes light that impinges on field emitter 10 from below the bottom surface of baseplate 20, the emitter electrodes are either transparent or, while opaque, are configured to let light pass to their sides at locations where light passage is needed. The resistive layer is normally partially transparent in that it transmits at least 30%, typically 60–80%, of incident visible light.

An electrically insulating layer 32 is situated on lower non-insulating region 30. Insulating layer 32, which serves as the inter-electrode dielectric, is normally transparent but can be opaque. When layer 32 is transparent, it typically consists of silicon oxide.

Figure 2A:
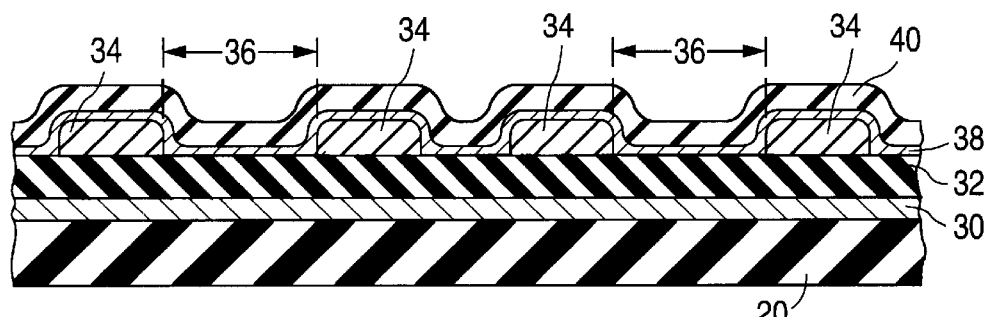
FIGS. 2a–2f are cross-sectional side views representing steps in accordance with the invention for manufacturing the electron-emitting device in the flat-panel display of FIG. 1. The cross sections of FIGS. 2a–2f are taken through plane 2—2 in FIG. 1.

A group of laterally separated generally parallel main control electrodes 34 are located on insulating layer 32. Two such control electrodes 34 are depicted in FIG. 2a. Electrodes 34 are normally opaque but can be transparent. A set of laterally separated control apertures 36 extend through each electrode 34 down to insulating layer 32. Control apertures 36 in each electrode 34 respectively overlie the emitter electrodes of lower non-insulating region 30. One control aperture 36 is depicted in FIG. 2a for each control electrode 34.

An electrically non-insulating gate layer 38 is situated on control electrodes 34. Gate layer 38, which is considerably thinner than control electrodes 34, extends down to insulating layer 32 within control apertures 36. In the exemplary process of FIG. 2, gate layer 38 is a blanket layer at the stage of FIG. 2a. Consequently, layer 38 also extends down to layer 32 in the spaces between apertures 36. Alternatively, at the stage of FIG. 2a, gate layer 38 can be patterned into laterally separated portions which contact control electrodes 34. Gate layer 38 normally consists of metal such as chromium having a thickness of 0.02–0.08 $\mu$m, typically 0.04 $\mu$m. As such, layer 38 is normally opaque. Layer 38 can, however, be transparent.

A track (or track-recording) layer 40 is provided on top of the structure. Track layer 40 is typically transparent but can be opaque. When layer 40 is transparent, it typically consists of polycarbonate having a thickness of 0.1–2 $\mu$m, typically 0.5 $\mu$m.

Figure 2B:
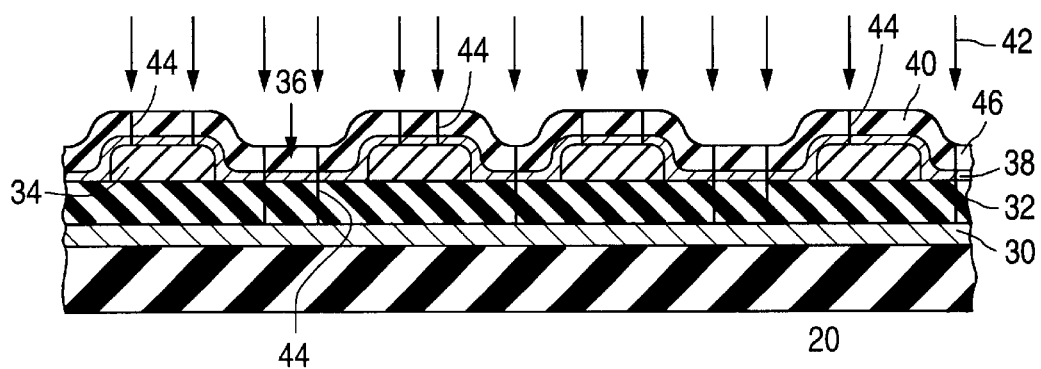
Figure 2C:
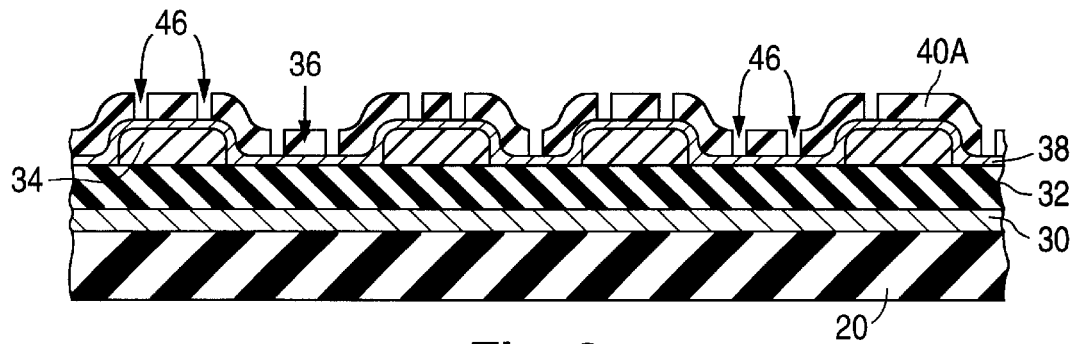

The structure in FIG. 2a is subjected to energetic charged particles 42, e.g., argon ions, that impinge on top of track layer 40 in a direction largely perpendicular to the lower surface of baseplate 20. Charged particles 42 have sufficient energy to form straight tracks 44 fully through layer 40 at random locations along layer 40 as indicated in FIG. 2b. Charged-particle tracks 44 typically extend through gate layer 38 and insulating layer 32 at locations not covered by control electrodes 34.

Charged-particle tracks 44 constitute zones of damaged material. Each track 44 has a heavily damaged core whose minimum diameter is in the vicinity of 4 nm. Although tracks 44 are randomly distributed along track layer 40, they have a well-defined average spacing. The areal track density is usually in the range of $10^6 10^9$ tracks/cm$^2$, typically $10^8$ tracks/cm$^2$. For illustrative purposes, only a small portion of tracks 44 are indicated in FIG. 2b.

Track layer 40 is brought into contact with a suitable chemical etchant that attacks the damaged material along charged-particle tracks 44 much more than the undamaged material of layer 40. Track pores 46 are thereby formed through layer 40 at the locations of tracks 44. See FIG. 2c in which item 40A is the remainder of layer 40. Some of the undamaged material along tracks 44 is normally removed. The etchant also normally attacks the track material along the upper surface of layer 40 so as to reduce its thickness. For simplicity, this thickness reduction is not shown in FIG. 2c. Portions of tracks 44 that extend beyond track layer 40A do not serve any useful function here and are not further illustrated in the drawings.

Track pores 46 are generally circular in shape as viewed perpendicular to the lower surface of baseplate 20. The average diameter of pores 46 can vary from 4 nm to 0.4 $\mu$m or more. The average pore diameter is preferably 0.02–0.2 $\mu$m, typically 0.1–0.15 $\mu$m.

The average diameter of track pores 46 is measured in accordance with the invention by using one of the present non-intrusive light-based analytical techniques described below. The light-scattering analytical technique described below can generally be employed to measure the average track pore diameter. Under certain circumstances, the average pore diameter can be measured with the light-transmission analytical technique described below. Whether the light-transmission technique can be employed to measure the average pore diameter depends on factors such as whether track layer 40A is transparent or opaque, whether gate layer 38 is transparent or opaque, whether main control electrodes 34 are transparent or opaque, whether insulating layer 32 is transparent or opaque, and whether the emitter electrodes in lower non-insulating region 30 are transparent or opaque.

Consider the situation in which gate layer 38 is transparent. If track layer 40A and main control electrodes 34 are opaque while insulating layer 32 and the emitter electrodes in lower non-insulating region 30 are transparent, the light-transmission analytical technique can be utilized to measure the average diameter of track pores 46 situated at the locations of control apertures 36. When track layer 40A, control electrodes 34, and the emitter electrodes are opaque while insulating layer 32 is transparent, the light-transmission technique can be utilized to measure the average diameter of pores 46 situated at locations that do not overlie the emitter electrodes.

Measurement of the average pore diameter can be performed after the formation of track pores 46 is complete. Alternatively, the average pore diameter can, in accordance with the invention, be measured as pores 46 are being created. The pore diameter measurement can be utilized to determine when to terminate the etch step. That is, the etch step is terminated when the average pore diameter reaches a prescribed value.

The areal density of track pores 46 is the same as the areal density of charged-particle tracks 44. When the track density is known, the pore density is therefore also known. In some cases, one of the light-based analytical techniques of the invention can be utilized to check the pore density or, if the pore density is not known, to determine the pore density.

Figure 2D:
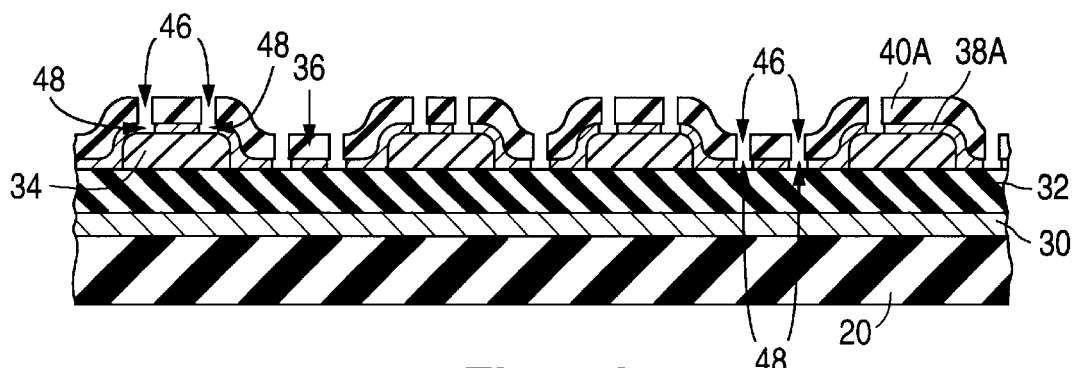

Using track layer 40A as an etch mask, the portions of gate layer 38 exposed through track pores 46 are removed with a suitable etchant to create generally circular openings 48 through gate layer 38 down to insulating layer 32. FIG. 2d illustrates the resultant structure in which item 38A is the remainder of gate layer 38. The etch may be substantially anisotropic, i.e., unidirectional, or may have an isotropic component. If the etch has an isotropic component, each gate opening 48 may be significantly wider than overlying pore 46. FIG. 2d illustrates an example of this situation. Gate openings 48 have an average diameter that varies from 0.02 $\mu$m to 0.4 $\mu$m or more. The average gate-opening diameter is preferably 0.05–0.2 $\mu$m, typically 0.1–0.15 $\mu$m.

The average diameter of gate openings 48 is normally measured according to one of the light-based analytical techniques of the invention. The selection of the light-based technique to measure the average gate-opening diameter depends on factors such as whether track layer 40A is transparent or opaque or has been removed, whether gate layer 38 is transparent or opaque, whether main control electrodes 34 are transparent or opaque, whether insulating layer 32 is transparent or opaque, and whether the emitter electrodes in lower non-insulating region 30 are transparent or opaque. When track layer 40A is transparent or has been removed, the light-scattering technique can be utilized to measure the average gate-opening diameter in the great majority of situations. Should layer 40A be present, pores 46 must be appropriately taken into account in utilizing the light-scattering technique.

Consider the situation in which gate layer 38 and main control electrodes 34 are opaque. If insulating layer 32 and the emitter electrodes in lower non-insulating region 30 are transparent and if track layer 40A is transparent or has been removed, the light-transmission technique can be employed to measure the average diameter of gate openings 48 situated at the locations of control apertures 36. If the emitter electrodes are opaque while insulating layer 32 is transparent and track layer 40A is transparent or has been removed, the light-transmission technique can be employed to measure the average diameter of gate openings 48 situated at locations that do not overlie the emitter electrodes.

Measurement of the average gate-opening diameter can be conducted after gate openings 48 are completed or during their formation. In the latter case, the etch of gate layer 38 can be terminated when the average gate-opening diameter reaches a prescribed value. To allow time for the gate etching operation to be terminated, the prescribed gate-opening diameter value may be somewhat less than the final target value for the average gate-opening diameter.

In addition, the average thickness of gate layer 38A can be determined in accordance with the invention using the composite light-scattering/light-transmission technique described below. When main control electrodes 34 are opaque while insulating layer 32 and the emitter electrodes in lower non-insulating region 30 are transparent and track layer 40A is transparent or has been removed, the average gate-layer thickness can be measured at locations where gate layer 38A does not overlie control electrodes 34. When control electrodes 34 and the emitter electrodes are opaque while insulating layer 32 is transparent and track layer 40A is transparent or has been removed, the average thickness of gate layer 38A can be measured at locations where layer 38A does not overlie control electrodes 34 or the emitter electrodes.

The areal density of gate openings 48 is the same as the areal density of track pores 46 and therefore the same as the areal density of charged-particle tracks 44. When the pore or track density is known, the gate-opening density is also known. In some cases, one of the present light-based analytical techniques can be employed to check the gate-opening density or, if it is not known, to determine the gate-opening density.

Figure 2E:
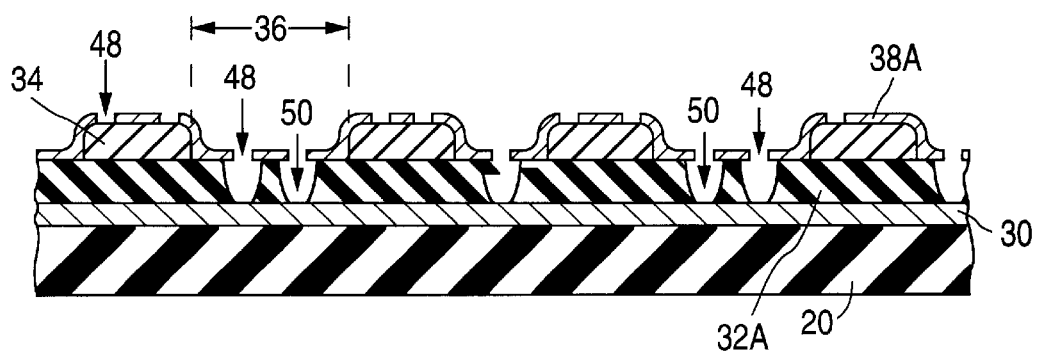

Track layer 40A is removed at some point after creating gate layer 38A. See FIG. 2e. Using gate layer 38A as a mask, portions of insulating layer 32 exposed through gate openings 48 are removed with suitable etchant to form generally circular openings 50 through insulating layer 32 down to lower non-insulating region 30. Item 32A in FIG. 2e is the remainder of insulating layer 32. Dielectric openings 50 are of average diameter that varies from 0.02 µm to 1 µm or more. The average dielectric-opening diameter is preferably 0.1–0.5 µm, typically 0.3 µm.

The average diameter of dielectric openings 50 is measured in accordance with the invention by using one of the present light-based analytical techniques. The selection of the light-based technique to measure the average diameter of dielectric openings 50 depends on factors such as whether track layer 40A is transparent or opaque or has been removed, whether gate layer 38A is transparent or opaque, whether main control electrodes 34 are transparent or opaque, whether insulating layer 32 is transparent or opaque, and whether the emitter electrodes in lower non-insulating region 30 are transparent or opaque. The presence of gate openings 50 and, if track layer 40A has not been removed, pores 46 must be appropriately taken into account in determining the average dielectric-opening diameter.

Consider the situation in which main control electrodes 34 are opaque and track layer 40A is transparent or has been removed. If the emitter electrodes in lower non-insulating region 30 are opaque while insulating layer 32 and gate layer 38A are transparent, the light-scattering technique can generally be employed to determine the average diameter of dielectric openings 50. The light-scattering technique can also generally be utilized to determine the average dielectric-opening diameter when gate layer 38A is transparent while the emitter electrodes and insulating layer 32 are opaque. When the emitter electrodes and gate layer 38A are transparent while insulating layer 32 is opaque, the light-transmission technique can be utilized to measure the average dielectric-opening diameter.

The areal density of dielectric openings 50 is the same as the areal density of gate openings 48 and thus the same as the areal density of track pores 46 and the areal density of charged-particle tracks 44. When the gate-opening density, pore density, or track density is known, the dielectric-opening density is also known.

Figure 2F:
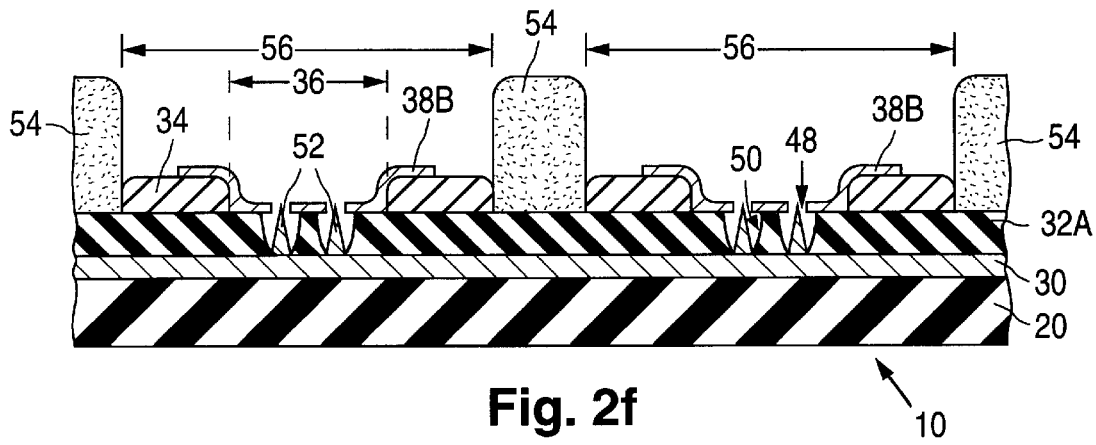

Conical electron-emissive elements 52 are respectively formed in dielectric openings 50 as shown in FIG. 2f. Each control opening 36 defines the lateral boundary for a group of electron-emissive cones 52. A system 54 that focuses electrons emitted from cones 52 is typically provided on top of the structure. Focus openings 56 extend through electron-focusing system 54 to expose cones 52. Each focus opening 56 is typically roughly concentric with, and wider than, a corresponding one of control openings 36.

If not previously patterned into separate gate portions, gate layer 38A is patterned into laterally separated gate portions 38B that contact main control electrodes 34. Each main control electrode 34 and one or more adjoining gate portions 38B form a composite control electrode 34/38B. Gate openings 48 that overlie main control electrodes 34 do not perform any function and are not illustrated in FIG. 2f. The formation of electron-emissive cones 52, electron-focusing system 54, and gate portions 38B can be performed in various sequences. Components 30, 32A, 34/38B, 52, and 54 constitute layers 22 of field emitter 10.

While the measurement of the average gate-opening diameter and the average gate-layer thickness is typically done during or immediately after forming gate openings 48, measurement of the average gate-opening diameter or/and the average gate-layer thickness can, in accordance with the invention, be performed at a later stage in the fabrication of field emitter 10. In particular, the techniques of the invention can be utilized to measure the average gate-opening diameter or/and the average gate-layer thickness at least at late as the stage of FIG. 2f. The same applies to the gate-opening density when it is measured according to one of the present light-based techniques. In addition, the light-scattering analytical technique of the invention can be employed to measure the average gate-opening diameter after field emitter 10 and light-emitting device 12 are sealed together through outer wall 14 and spacer walls 16 to form the final FED.

Figure 3:
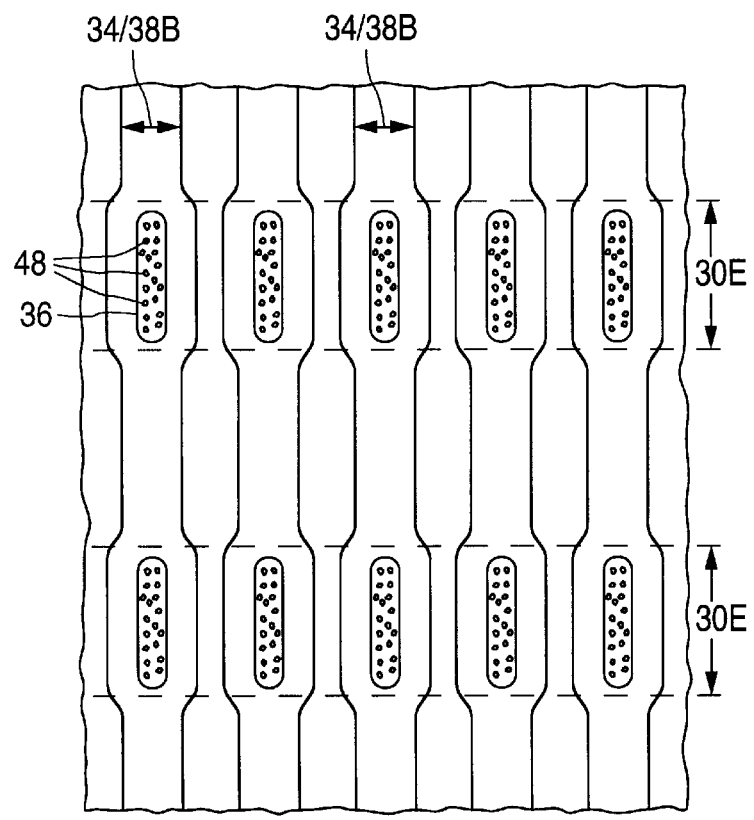
FIG. 3 is a layout view of part of the electron-emitting device of FIG. 2f.

FIG. 3 presents an electrode layout of field emitter 10 in FIG. 2f. Items 30E in FIG. 3 generally represent the emitter electrodes of lower non-insulating region 30. Five composite control electrodes 34/38B are depicted in FIG. 3. As FIG. 3 illustrates, each main control opening 36 overlies one of emitter electrodes 30E and laterally circumscribes a group of electron-emissive cones 48. Also, emitter electrodes 30E cross control electrodes 34/38B in a generally perpendicular manner.

Figure 4:
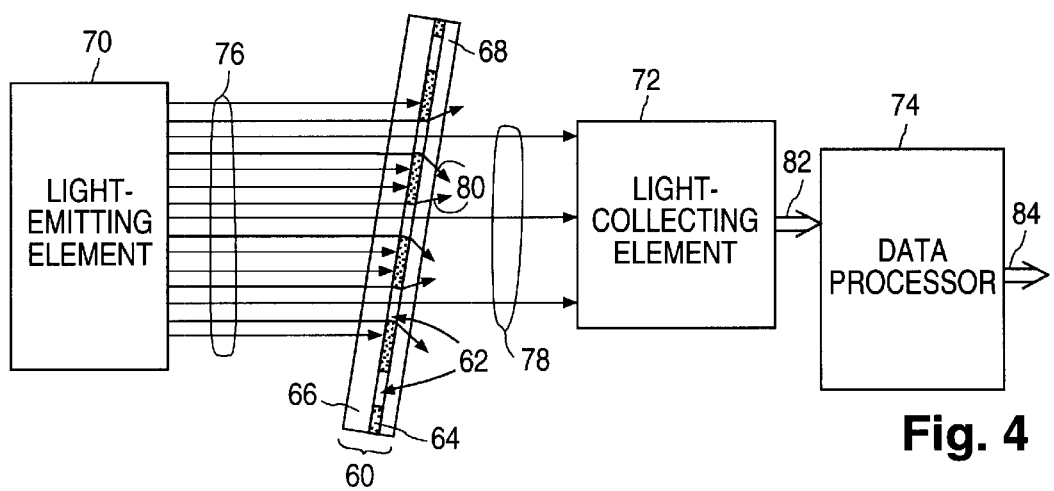
FIG. 4 is a block diagram of an analytical system that uses a light-transmission technique in accordance with the invention for determining dimensional information, typically average opening diameter, for a perforated layer of an object such as part of a flat-panel CRT display.

Light-transmission Technique for Determining Dimensional Information, Particularly Average Opening Diameter FIG. 4 illustrates an analytical system that utilizes a light-transmission technique in accordance with the invention for determining dimensional information about an object 60 such as field emitter 10 or a partially finished version of field emitter 10. The dimensional information normally includes the average diameter $d_{AV}$ of openings 62 that extend fully through a perforated layer 64 of object 60. Perforated layer 64 may be electrically insulating or electrically non-insulating. Layer 64 may have additional openings (not shown) through which light does not readily penetrate or through which the transmission of light is appropriately taken into account (i.e., compensated for) in determining the desired dimensional information. Although FIG. 4 depicts layer 64 as being flat and of relatively uniform thickness, layer 64 may be significantly curved and may have substantial variation in thickness.

Object 60 is generally represented in FIG. 4 as having a pair of bodies 66 and 68 sandwiched around layer 64. Portions of body 66 or/and body 68 may occupy openings 62. Also, portions of bodies 66 and 68 may be variously intermingled with each other through additional openings (not shown) through layer 64. Furthermore, either or both of bodies 66 and 68 may be absent.

Openings 62 are typically implemented as gate openings 48. In this case, perforated layer 64 is gate layer 38A or 38B depending on the stage at which the gate-opening diameter is measured. One of bodies 66 and 68 consists of baseplate 20, lower non-insulating region 30, insulating layer 32 or 32A, main control electrodes 34, and possibly electron-focusing system 54. The other of bodies 66 and 68 is either track layer 38A or is absent if layer 38A has been removed at the stage of the gate-opening diameter measurement. Focusing system 54 may also be viewed as part of this one of bodies 66 and 68. Similar analogies arise when openings 62 are implemented as track pores 46 or dielectric openings 50.

The light-transmission-based analytical system in FIG. 4 contains a light-emitting structure and a light-collecting structure. The light-emitting structure consists of a primary light-emitting element 70 such as an incandescent lamp, a mercury lamp, a halogen lamp, a light-emitting diode, a laser, or a group of such lamps, diodes, or/and lasers. The light-collecting structure consists of a primary light-collecting element 72 such as a camera, typically of the charge-coupled device ("CCD") type. Light-emitting element 70 and light-collecting element 72 are situated over opposite sides of object 60 so as to be substantially in alignment through at least part of openings 62, typically through most of openings 62. Light-collecting element 72 is typically fixed, but may be movable, relative to object 60. The analytical system also contains a data processor 74 typically located at a substantial distance away from the remainder of the analytical system. Data processor 74 may be located physically close to the remainder of the analytical system provided, of course, that processor 74 does not interfere with the operation of elements 70 and 72.

The analytical system of FIG. 4 operates in the following way. Elements 70 and 72 and object 60 are situated in a very dark room. Light-emitting element 70 emits light that passes through body 66 (when present) and impinges on layer 64. Item 76 in FIG. 4 represents part or all of the emitted impinging light depending on the characteristics of light-emitting element 70 and the average diameter $d_{AV}$ of openings 62. In particular, emitted light 76 is formed with light of wavelength greater than or equal to a principal wavelength value $\lambda_P$.

Light-emitting element 70 may emit light across a (continuous) wavelength band. If the wavelength of the light at the low end of the band is greater than principal value $\lambda_P$, emitted light 76 consists of all of the light in the band. If, as is typically the case, value $\lambda_P$ lies between the wavelengths at the low and high ends of the band, light 76 is formed by the band portion that has wavelength greater than or equal to $\lambda_P$. In this case, additional light of wavelength less than $\lambda_P$ passes through body 66 and impinges on layer 64 after being emitted by element 70. Aside possibly from being filtered out or otherwise effectively removed at some point, the additional low-wavelength light is normally not utilized in the analytical system of FIG. 4.

Light 76 typically consists of visible light in the form of white light. That is, the intensity of light 76 varies with wavelength across the visible light band (spectrum) in a manner suitable for white light. In the white-light case, value $\lambda_P$ is approximately less than or equal to the 0.4 $\mu$m wavelength value at the low end of the visible spectrum.

Alternatively, light-emitting element 70 may emit light concentrated at one or more generally distinct wavelengths. Emitted light 76 then consists largely of light at each distinct wavelength greater than or equal to principal value $\lambda_P$. Once again, light 76 is typical visible light. For example, light 76 can be blue light at a wavelength near the low end of the visible spectrum or red light at a wavelength near the high end of the visible spectrum.

Light-emitting element 70 may include a light filter that substantially attenuates light of wavelength less than principal value $\lambda_P$. In such cases, element 70 typically includes a light source that emits light of wavelength both greater than and less than $\lambda_P$ in a direction towards object 60. The filter is placed between the light source and object 60 for removing light of wavelength less than $\lambda_P$. The light that passes through the filter constitutes emitted light 76.

Average diameter $d_{AV}$ of openings 62 is normally less than principal wavelength value $\lambda_P$. That is, average opening diameter $d_{AV}$ is less than the wavelengths of the light waves that constitute emitted light 76. Although the specific value of diameter $d_{AV}$ is typically not known prior to the measurement operation of the invention (unless a previous $d_{AV}$ measurement has been performed), the nature of openings 62 is controlled in such a way that diameter $d_{AV}$ is invariably less than the wavelengths of the light waves that form light 76.

Preferably, opening diameter $d_{AV}$ is less than $\lambda_P/2$. Diameter $d_{AV}$ is often less than $\lambda_P/4$. Alternatively stated, principal wavelength value $\lambda_P$ is normally greater than, preferably more than twice, often more than four times, diameter $d_{AV}$.

A specific value can be assigned to principal wavelength value $\lambda_P$. For example, value $\lambda_P$ can be approximately 0.4 $\mu$m, the wavelength at the low end of the visible spectrum. In that case, opening diameter $d_{AV}$ is less than 0.4 $\mu$m, preferably less than 0.2 $\mu$m, as is typically the case with track pores 46 and gate openings 48. More generally, however, value $\lambda_P$ is simply a parameter that facilitates describing the relationship between diameter $d_{AV}$ and the wavelength characteristics of emitted light 76. The specific value of parameter $\lambda_P$ is not important as long as this relationship exists, i.e., that diameter $d_{AV}$ is less than, preferably less than one half of, often less than one fourth of, the wavelengths of the light waves that form light 76.

In FIG. 4, emitted light 76 is illustrated as being largely collimated. In other words, the photons in light 76 move largely parallel to one another. However, light 76 is typically somewhat non-collimated. For the purposes of generality, FIG. 4 illustrates light 76 as impinging somewhat non-perpendicularly on object 60, i.e., as impinging slightly non-perpendicularly on an imaginary plane that extends along the nearest outside surface of object 60. The angle between light 76 and object 60 is in the vicinity of 45° in a typical configuration of object 60 and elements 70 and 72. When light 76 impinges non-perpendicularly on object 60, shadowing caused by the thickness of layer 64 reduces the effective lateral area for light to be transmitted through openings 62 without encountering the edges of openings 62. The effect of such thickness-caused shadowing is appropriately taken into account in determining average opening diameter $d_{AV}$. Alternatively, light 76 can impinge largely perpendicularly on object 60.

Part of emitted light 76 passes through openings 62 and body 68 (when present) without significant scattering (or diffraction). Light-collecting element 72 contains a light collector which collects light 78 so transmitted through openings 62. For this purpose, body 68 is either transparent or has suitable openings at the locations where transmitted light 78 passes through body 68. The wavelength of transmitted light 78 is largely the same as the wavelength of emitted light 76 and thus is normally greater than or equal to principal wavelength value $\lambda_P$. In collecting light 78, element 72 may be scanned over object 60. Light 78 largely forms a light-intensity pattern generally representative of openings 62.

A portion 80 of emitted light 76 undergoes sufficient scattering during propagation through openings 62 so as to not be collected by light-collecting element 72. Although not indicated in FIG. 4, other portions of light 76 fail to reach element 72 for various reasons. For example, part of light 76 reflects off, or/and is absorbed by body 66 and layer 64. Also, some of light 76 can be absorbed by or/and scattered off, body 68 after passing through openings 62. When element 72 is scanned over object 60, part of light 76 is transmitted through openings 62 but passes to the side of the light collector in element 72 and thus is not collected by element 72.

Light-collecting element 72 provides a composite signal 82 representative of the intensity of transmitted light 78. When element 72 is a CCD camera, composite signal 82 is normally a sequence of data corresponding to the image formed by transmitted light 78.

Light-collecting element 72 may include a light filter that substantially attenuates light of wavelength less than principal value $\lambda_P$. The filter is placed between object 60 and the light collector in element 72. Alternatively, element 72 may be responsive substantially only to transmitted light 78 of wavelength greater than $\lambda_P$. In such cases, composite signal 82 does not have a signal component arising from light of wavelength less than $\lambda_P$.

Data processor 74 evaluates composite signal 82 to determine the desired dimensional information about object 60. As mentioned above, the dimensional information normally includes average diameter $d_{AV}$ of openings 62. The dimensional information is provided in the form of an output signal 84 generated by processor 74 in response to composite signal 82. In some cases, composite signal 82 may include a signal component arising from transmitted light of wavelength less than principal value $\lambda_P$. If so, in generating output signal 84, processor 74 normally eliminates the effect of, e.g., subtracts out, or otherwise compensates for, the effect of such a component in composite signal 82.

Figure 5:
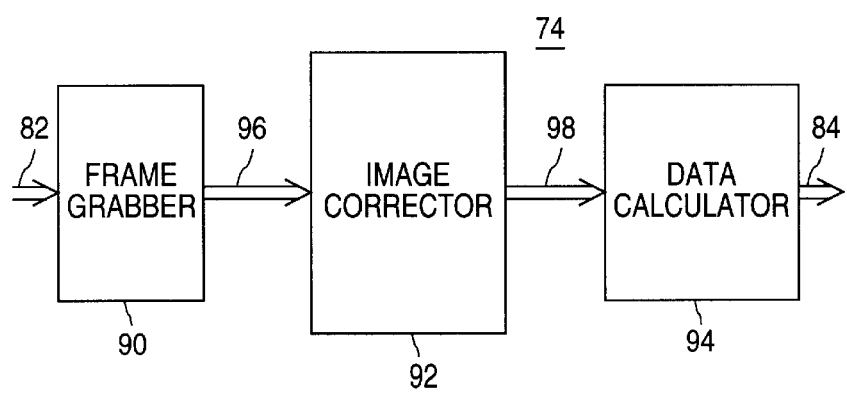
FIG. 5 is a block diagram of the data processor in the analytical system of FIG. 4.

FIG. 5 illustrates a basic configuration for data processor 74 when light-collecting element 72 is a camera. In the embodiment of FIG. 5, processor 74 consists of a frame grabber 90, an image corrector 92, and a data calculator 94. Frame grabber 90 converts composite signal 82 into a digital frame signal 96 representing the image. Image corrector 92 operates on frame signal 96 to produce a corrected digital frame signal 98 that compensates for known error in composite signal 82. Such error may arise, for example, due to attenuation in transmitted light 78 in passing through body 68 (when present). Finally, data calculator 94 performs calculations on corrected frame signal 98 to produce processor output signal 84.

Figure 6:
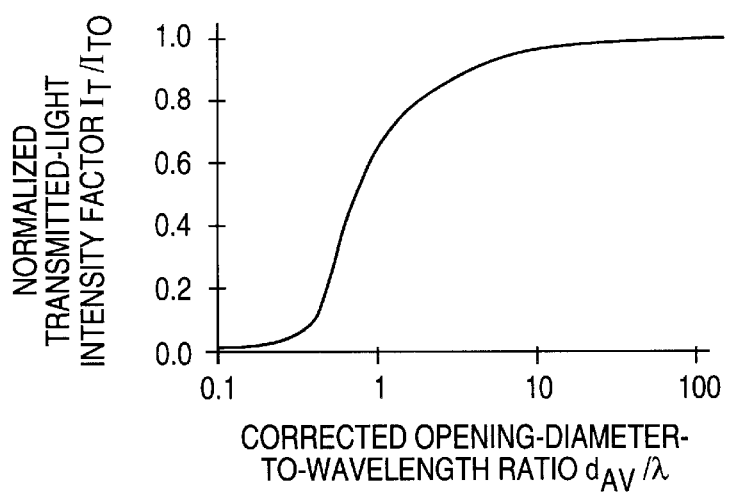
FIG. 6 is a graph of transmitted-light intensity factor as a function of opening-diameter-to-wavelength ratio for measurement on the object in FIG. 4.

An understanding of how the analytical system of FIG. 4, particularly data processor 74, operates to generate output signal 84 as the desired dimensional information is facilitated with the assistance of the graph of FIG. 6. For transmitted light 78 at substantially a wavelength $\lambda$, the horizontal axis in FIG. 6 represents the ratio of the average diameter $d_{AV}$ of openings 62 to wavelength $\lambda$. Opening-diameter-to-wavelength ratio $d_{AV}/\lambda$ is characterized by the word "corrected" in FIG. 6 to reflect the fact that compensation is made for error in composite signal 82.

The vertical axis in FIG. 6 presents the normalized intensity factor $I_T/I_{T0}$ for transmitted light 78. Parameter $I_T$ is the actual average intensity of transmitted light 78. Parameter $I_{T0}$ is the average intensity that transmitted light 78 would have at the short-wavelength limit of geometric optics, i.e., as wavelength $\lambda$ goes to (but does not reach) zero. Light intensity, as represented by intensity $I_T$ or $I_{T0}$, is a per-unit-area parameter. For example, light intensity can be given in watts per square meter.

Let $I_E$ represent the average intensity of emitted light 76 impinging on object 60. For the situation in which openings 62 do not significantly overlap one another, short-wavelength-limit transmitted-light intensity $I_{T0}$ approximately equals $\alpha_T F_{GT} N_{OP} A_{OP} I_E$ where $\alpha_T$ is the dimensionless transmissivity factor for light to be transmitted through object 60 by way of openings 62, $F_{GT}$ is a dimensionless geometric factor that accounts for the thickness-caused shadowing which reduces the effective area for light to be transmitted through openings 62 without encountering the edges of openings 62, $N_{OP}$ is the areal density of openings 62, i.e., the number of openings 62 per unit area across which light 76 impinges on object 60, and $A_{OP}$ is the average lateral area occupied by an opening 62.

Transmissivity factor $\alpha_T$ lies between 0 and 1 depending on the light-transmission characteristics of bodies 66 and 68. Geometric factor $F_{GT}$, which likewise lies between 0 and 1, is close to 1 when emitted light 76 impinges largely perpendicularly on object 60 or/and the thickness of layer 64 is small compared to average opening diameter $d_{AV}$.

Light propagating into openings 62 invariably undergoes some scattering. At the short-wavelength limit where ratio $d_{AV}/\lambda$ is much greater than 1, effectively infinite, the light scattering is insignificant compared to the light transmission through openings 62. Hence, actual transmitted-light intensity $I_T$ equals $I_{T0}$ at the short-wavelength limit. In other words, transmitted-light intensity factor $I_T/I_{T0}$ is 1 when, as shown in FIG. 6, ratio $d_{AV}/\lambda$ is much greater than 1. Since short-wavelength-limit intensity $I_{T0}$ is proportional to average opening area $A_{OP}$ which, in turn, is proportional to the square of opening diameter $d_{AV}$, actual intensity $I_T$ is proportional to the square of diameter $d_{AV}$ for ratio $d_{AV}/\lambda$ much greater than 1.

At the long-wavelength limit, i.e., when ratio $d_{AV}/\lambda$ is much less than 1, the scattering of light that propagates into openings 62 is significant compared to the light transmission through openings 62. For ratio $d_{AV}/\lambda$ much less than 1, actual transmitted-light intensity $I_T$ varies approximately according to the sixth power of opening diameter $d_{AV}$. The higher-power $d_{AV}$ dependency occurs regardless of whether layer 64 is electrically conductive, electrically resistive, or electrically insulating. As indicated in FIG. 6, transmitted-light intensity factor $I_T/I_{T0}$ goes to zero as ratio $d_{AV}/\lambda$ goes to zero.

Between the short-wavelength and long-wavelength limits, actual transmitted-light intensity $I_T$ is a complex function of ratio $d_{AV}/\lambda$ (and other parameters) In general, the dependency of intensity $I_T$ on the power of ratio $d_{AV}/\lambda$ increases as ratio $d_{AV}/\lambda$ decreases. The transition between the short-wavelength and long-wavelength limits for intensity $I_T$ is depicted qualitatively in FIG. 6.

Actual transmitted light intensity $I_T$ is approximately proportional to opening density $N_{OP}$ when openings 62 do not significantly overlap one another. When the centers of openings 62 are distributed randomly across layer 64, some of openings 62 form composite openings whose average diameter is greater than $d_{AV}$. For random distribution of the centers of openings 62, the number of overlaps is approximately proportional to the square of opening density $N_{OP}$. As a result, actual intensity $I_T$ varies more than lineraly, i.e., at an $N_{OP}$ power greater than 1, when openings 62 significantly overlap.

Data processor 74 operates generally in accordance with the relationship shown in FIG. 6 to calculate output signal 84. Because average opening diameter $d_{AV}$ is less than principal wavelength value $\lambda_P$, processor 74 specifically operates in accordance with the portion of the curve for which ratio $d_{AV}/\lambda$ is less than 1.

Processor 74 can determine the desired dimensional information by directly using the curve of FIG. 6. Areal density $N_{OP}$ of openings 62 in layer 60 is furnished to processor 74. Using this data and composite signal 82, processor 74 calculates dimensional information 84.

Alternatively, actual transmitted-light intensity $I_T$ or data representative of intensity $I_T$ can be determined as a function of average opening diameter $d_{AV}$, wavelength, and short-wavelength-limit intensity $I_{T0}$ or data representative of intensity $I_{T0}$ for one or more specimens of object 60 for which diameter $d_{AV}$ is known. This data is then entered into processor 74 in order to calibrate it. Certain other characteristics of object 60, such as layer thicknesses, are also furnished to processor 74 to implement the calibration. Opening density $N_{OP}$ is again furnished to processor 74. With processor 74 suitably calibrated, processor 74 processes composite signal 82 to calculate dimensional information 84.

Rather than providing opening density $N_{OP}$ as input data to processor 74, density $N_{OP}$ can be determined by a procedure that also entails collecting light transmitted through openings 62 under conditions in which the light is of wavelength much less than average opening diameter $d_{AV}$. This light, referred to here as short-wavelength light, is typically UV light. For example, the short-wavelength light can be UV light of wavelength in the vicinity of 0.25 µm. A mercury lamp may provide the approximately 0.25-µm UV light.

Depending on the characteristics of primary light-emitting element 70, the short-wavelength light can be provided by element 70 or by another light-emitting element in the light-emitting structure that contains element 70. Likewise, the short-wavelength light can be collected by primary light-collecting element 72 or by another light-collecting element in the light-collecting structure that contains element 72. The light-collecting element (however implemented) provides data processor 74 with a composite signal representative of the intensity of the collected short-wavelength light.

In the procedure for determining opening density $N_{OP}$, the wavelength for emitted light 76, and thus the wavelength for transmitted light 78, is controlled in such a way as to be close to the long wavelength limit where ratio $d/\lambda$ is much less than 1. By generating composite signal 82 for this long-wavelength light and generating a corresponding composite signal for the short-wavelength light for which ratio $d_{AV}/\lambda$ is much greater than 1, the following approximate non-linear equations result:

$$A N_{OP}^z d_{AV}^6 = M_A \qquad (1)$$

$$B N_{OP}^z d_{AV}^2 = M_B \qquad (2)$$

where A and B are empirical constants determined from a suitable mathematical analysis or by using reference specimens of object 60 for which opening density $N_{OP}$ and average opening diameter $d_{AV}$ are known, exponent z is a positive integer normally equal to or greater than 1, $M_A$ is a measured value representing the intensity of transmitted light 78 at the long-wavelength limit, and $M_B$ is a measured value representing the intensity of the collected transmitted short-wavelength light. Exponent z is 1 when openings 62 do not significantly overlap. For significant overlap of openings 62 as typically occurs with a random distribution of the centers of openings 62, exponent z is typically somewhat greater than 1

Solving Eqs. 1 and 2 yields the following approximate values for average opening diameter $d_{AV}$ and opening density $N_{OP}$:

$$d_{AV} = \left(\frac{M_A B}{A M_B}\right)^{1/4} \qquad (3)$$

$$N_{OP} = \left(\frac{A M_B^3}{M_A B^3}\right)^{1/2z} \qquad (4)$$

Processor 74 is typically programmed to calculate diameter $d_{AV}$ and density $N_{OP}$ from Eqs. 3 and 4.

Figure 7:
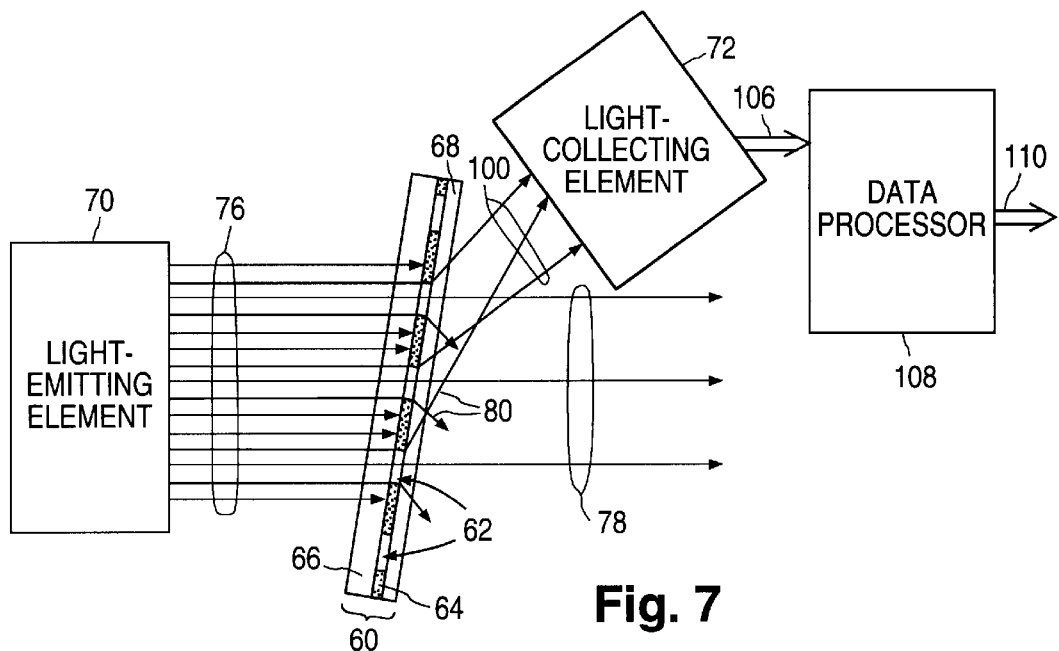
FIG. 7 is a block diagram of an analytical system that uses a light-scattering technique in accordance with the invention for determining dimensional information, typically average opening diameter, for a perforated layer of an object such as part of a flat-panel CRT display.
Figure 8:
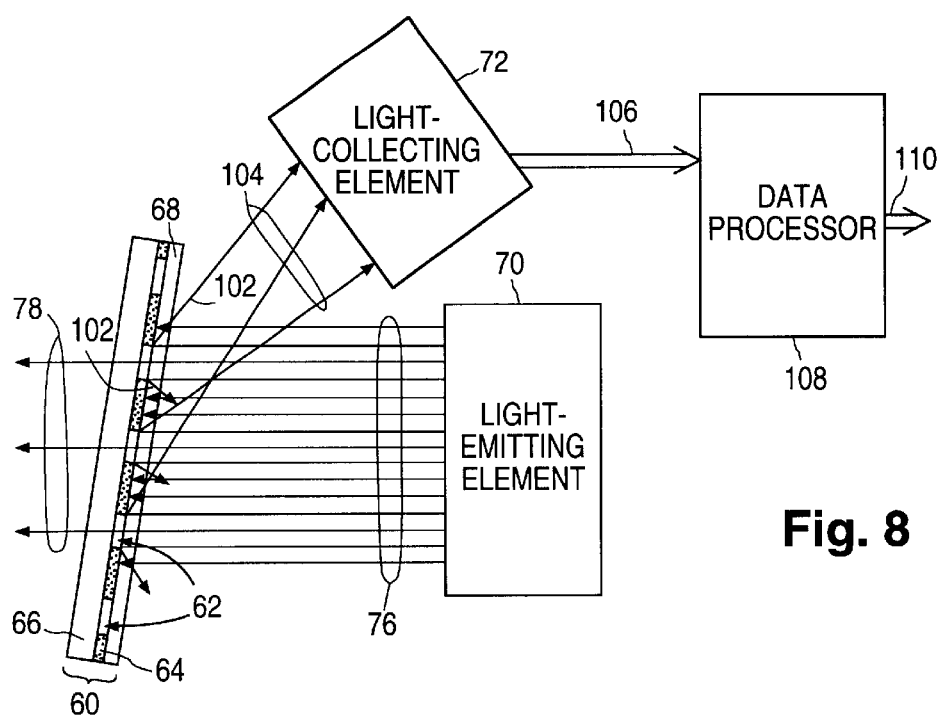
FIG. 8 is a block diagram of another analytical system that uses a light-scattering technique in accordance with the invention for determining dimensional information, again typically average opening diameter, for a perforated layer of an object such as part of a flat-panel CRT display.

Light-scattering Technique for Determining Dimensional Information, Particularly Average Opening Diameter FIGS. 7 and 8 illustrate a pair of analytical systems that employ a light-scattering technique in accordance with the invention for determining dimensional information about object 60. The dimensional information again typically includes average diameter $d_{AV}$ of openings 62 in perforated layer 64. Except for the orientation differences described below, the analytical systems of FIGS. 7 and 8 are configured largely the same and operate in largely the same manner. For convenience, the analytical systems of FIGS. 7 and 8 are discussed together in the following material.

The light-scattering-based analytical system of each of FIGS. 7 and 8 contains a light-emitting structure and a light-collecting structure formed respectively with primary light-emitting element 70 and primary light-collecting element 72. Elements 70 and 72 and object 60 are situated in a very dark room during system operation. Elements 70 and 72 in the analytical system of FIG. 7 or 8 are typically implemented in the manner described above for the light-transmission-based analytical system of FIG. 4.

Light-emitting element 70 again provides emitted light 76 having the above-described characteristics, including wavelength greater than or equal to principal wavelength value $\lambda_P$. In the analytical system of FIG. 7, emitted light 76 passes through body 66 and impinges on layer 64. Light 76 passes through body 68 and impinges on layer 64 in the analytical system of FIG. 8. Whether light 76 passes through body 66 or body 68 in each of FIGS. 7 and 8 is arbitrary and could be reversed.

The analytical system of FIG. 7 is arranged so that (a) light-emitting element 70 and light-collecting element 72 are positioned over opposite sides of object 60 and (b) element 72 is not in alignment with element 70 through openings 62. Light-collecting element 72 thus does not collect a significant fraction of transmitted light 78 in FIG. 7. Instead, element 72 collects a portion 100 of light 80 that undergoes scattering in propagating into and through openings 62. In collecting scattered light 100, element 72 may be scanned over object 60. Also, as described below, emitted light 76 may cause diffraction patterns, i.e., patterns of constructive/destructive interference, to be projected away from object 60 in certain directions that differ from the direction of transmitted light 78. In the system of FIG. 7, element 72 is located so as to avoid receiving light that forms these diffraction patterns.

The analytical system of FIG. 8 is arranged so that light-emitting element 70 and light-collecting element 72 are positioned over the same side of object 60. Due to this positioning, light-collecting element 72 is not in the path of emitted light 76. In the system of FIG. 8, a part 102 of emitted light 76 is scattered backwards in propagating into openings 62 and passes back through body 68. Element 72 in FIG. 8 collects a portion 104 of scattered light 102. In collecting scattered light 104, element 72 may be scanned over object 60. Similar to how element 72 is located in FIG. 7, element 72 in FIG. 8 is also located so as to avoid receiving light that forms any diffraction patterns resulting from emitted light 76 impinging on object 60.

Body 60 is normally positioned relative to elements 70 and 72 in such a manner that emitted light 76 impinges somewhat non-perpendicularly on object 60 in the analytical systems of FIGS. 7 and 8. The angle between light 76 and object 60 is normally in the vicinity of 45° for a typical arrangement of object 60 in the system of FIG. 7 or 8.

In some cases, especially when light-emitting element 70 emits light across a (continuous) wavelength band, additional light of wavelength less than principal wavelength value $\lambda_P$ may be scattered in propagating into openings 62 after being emitted by element 70. Some of this additional scattered light may then impinge on light-collecting element 72. Aside from being filtered out or otherwise effectively removed at some point, the additional low-wavelength scattered light is normally not used in the analytical system of FIG. 7 or 8.

Scattered light 100 in the system of FIG. 7 forms a light-intensity pattern generally representative of openings 62. Likewise, scattered light 104 in the system of FIG. 8 forms a light-intensity pattern generally representative of openings 62. Scattered light 100 and 104 is of largely the same wavelength as transmitted light 76. That is, the wavelength of scattered light 100 or 104 is normally greater than or equal to principal wavelength value $\lambda_P$. Consequently, average diameter $d_{AV}$ of openings 62 is less than, preferably less than one half of, often less than one fourth of, the wavelength of scattered light 100 or 104.

Light-collecting element 72 in the system of FIG. 7 or 8 provides a composite signal 106 representative of the intensity of scattered light 100 or 104. Similar to what occurs in the system of FIG. 4, composite signal 106 is normally a sequence of data corresponding to the image represented by scattered light 100 or 104 when element 72 is a CCD camera. The brightness of the image generally defines its intensity and is reflected in composite signal 106. Likewise, element 72 in FIG. 7 or 8 may be responsive substantially only to scattered light 100 or 104 of wavelength greater than principal value $\lambda_P$ or may include a filter that substantially attenuates light of wavelength less than $\lambda_P$. In such cases, signal 106 does not have a significant component arising from light of wavelength less than $\lambda_P$.

The analytical system of each of FIGS. 7 and 8 contains a data processor 108 that evaluates composite signal 106 to determine the desired dimensional information. Data processor 108 is typically located at a substantial distance away from the remainder of the system of FIG. 7 or 8 but may be in close proximity to the remainder of the system. Processor 108 may be the same physical hardware as processor 74.

The dimensional information generated by data processor 108 typically includes average opening diameter $d_{AV}$. The dimensional information is provided in the form of an output signal 110 generated by data processor 108 in response to composite signal 106. If composite signal 106 includes a signal component arising from scattered light of wavelength less than principal value $\lambda_P$, processor 108 generates output signal 110 in such a manner as to eliminate the effect of, or otherwise compensate for, the effect of such a short-wavelength component in composite signal 106.

Figure 9:
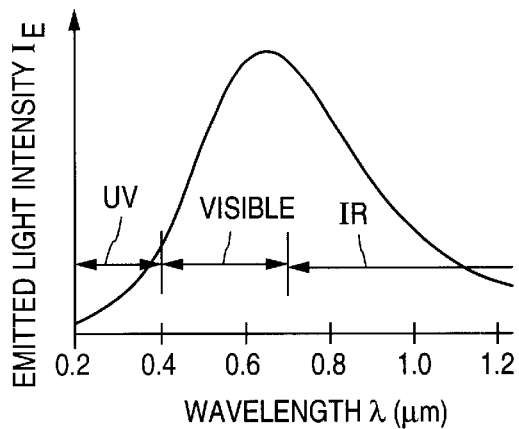
FIG. 9 is a graph of emitted light intensity as a function of wavelength for a typical source of visible light.

An understanding of how the analytical system of FIG. 7 or 8, particularly data processor 108, operates to generate processor output signal 110 as the desired dimensional information is facilitated with the assistance of the graphs of FIGS. 9, 10, 11, and 12. FIG. 9 depicts how the intensity $I_E$ of the light emitted by a typical light source employed in light-emitting element 70 varies with the wavelength $\lambda$ of the emitted light. With light being emitted at suitable intensity across the entire visible spectrum from approximately 0.4 $\mu$m to approximately 0.7 $\mu$m, the light source represented by the graph of FIG. 9 provides white light.

Figure 10:
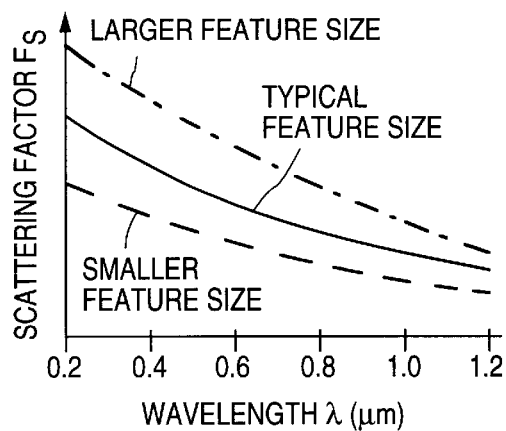
FIG. 10 is a graph of scattering factor as a function of wavelength for light scattered off edges of features such as openings in an object.

The intensity $I_S$ of light which undergoes scattering as the light encounters a surface is, as a function of wavelength $\lambda$, the product of emitted light intensity $I_E$ and a scattering factor $F_S$. FIG. 10 illustrates how scattering factor Fs varies with wavelength $\lambda$ as a function of the feature size that causes the light scattering. As FIG. 10 indicates, scattering factor $F_S$ decreases with increasing wavelength $\lambda$. Factor $F_S$ also increases as the size of the light-scattering feature increases. When the light-scattering feature is the edge of an opening, the size of the feature is determined by the perimeter of the opening. Since the perimeter of an opening is proportional to its diameter, factor $F_S$ for openings 62 increases with increasing average $d_{AV}$ at a given value of wavelength $\lambda$.

Figure 11:
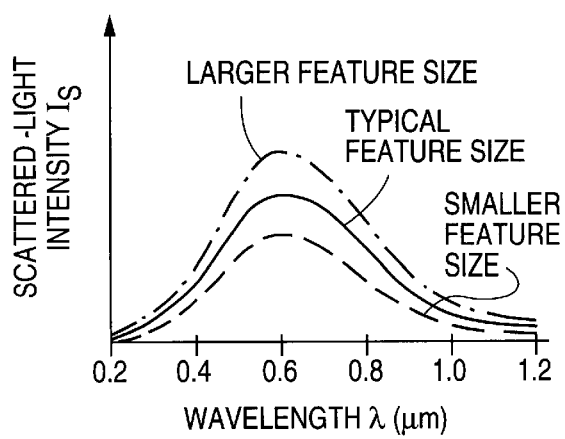
FIG. 11 is a graph of scattered-light intensity as a function of wavelength for light scattered off edges of features such as openings in an object.

FIG. 11 depicts how scattered-light intensity $I_S$ varies with wavelength $\lambda$ for the light source represented by the graph of FIG. 9 when the surface that causes the light scattering has the scattering characteristics represented in FIG. 10. Because scattering factor $F_S$ decreases with increasing wavelength $\lambda$, scattered-light intensity $I_S$ is effectively shifted to slightly lower wavelength compared to emitted-light intensity $I_E$. Due to the variation of scattering factor $F_S$ with feature size, scattered-light intensity $I_S$ increases with increasing feature size. For openings 62, intensity $I_S$ of light that undergoes scattering as the light propagates into openings 62 thus increases with increasing average opening diameter $d_{AV}$.

Figure 12:
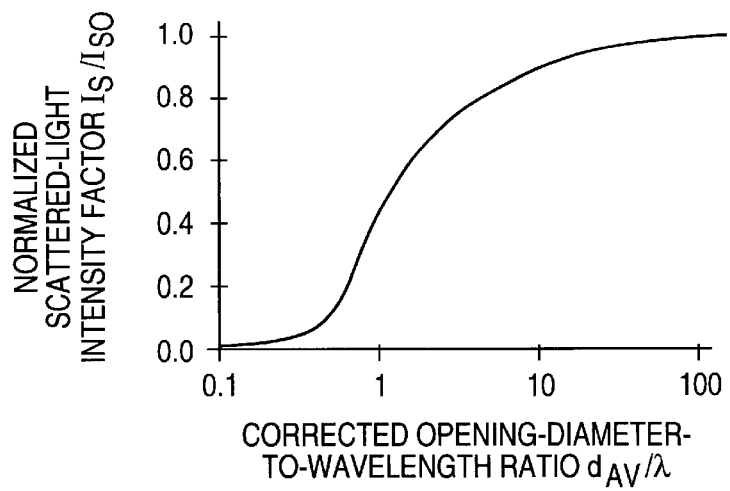
FIG. 12 is a graph of scattered-light intensity factor as a function of opening-diameter-to-wavelength ratio for measurement on the object in FIG. 7 or 8.

Turning to FIG. 12, the horizontal axis represents the ratio of average diameter $d_{AV}$ of openings 62 to the wavelength $\lambda$ of scattered light 100 or 104 for the situation in which light 100 or 104 is substantially at wavelength $\lambda$. The word "corrected" is employed in describing ratio $d_{AV}/\lambda$ in FIG. 12 to reflect the fact that correction is made in composite signal 106 for error that arises, for example, due to the passage of light 100 or 104 through body 68.

The vertical axis in FIG. 12 presents the normalized intensity factor $I_S/I_{S0}$ for scattered light 100 or 104. Parameter $I_S$ here is specifically the intensity of scattered light 100 or 104 along the exterior surface of body 68. Parameter $I_{S0}$ is the average intensity that scattered light 100 or 104 would have along the exterior surface of body 68 at the short-wavelength limit of geometric optics, i.e., as wavelength $\lambda$ goes to zero.

Actual scattered-light intensity $I_S$ equals $I_{S0}$ at the short-wavelength limit. That is, scattered-light intensity factor $I_S/I_{S0}$ is 1 when, as shown in FIG. 12, ratio $d_{AV}/\lambda$ is much greater than 1. Actual intensity $I_S$ for scattered light 78 is proportional to average opening diameter $d_{AV}$ when ratio $d_{AV}/\lambda$ is much greater than 1 and openings 62 do not significantly overlap. This linear $I_S$ dependency on diameter $d_{AV}$ at the short-wavelength limit arises because both dipole and multipole magnetic fields at openings 62 influence the light scattering for ratio $d_{AV}/\lambda$ much greater than 1.

At the long-wavelength limit where ratio $d_{AV}/\lambda$ is much less than 1, the scattering of light as it propagates into openings 62 arises largely from dipole magnetic fields at openings 62 rather than from a combination of dipole and multipole magnetic fields at openings 62 as occurs at the short-wavelength limit. Due to the change in light-scattering mechanism in going from the short-wavelength limit to the long-wavelength limit, actual scattered-light intensity $I_S$ varies approximately according to the sixth power of opening diameter $d_{AV}$ at the long-wavelength limit. The higher-power $d_{AV}$ dependency occurs irrespective of the electrically insulating, electrically resistive, or electrically conductive nature of layer 64. As indicated in FIG. 12, scattered-light intensity factor $I_S/I_{S0}$ goes to zero as ratio $d_{AV}/\lambda$ goes to zero.

Between the short-wavelength and long-wavelength limits, actual scattered-light intensity $I_S$ is a complex function of ratio $d_{AV}/\lambda$ (and other parameters). The dependency of intensity $I_S$ on the power of ratio $d_{AV}/\lambda$ generally increases as ratio $d_{AV}/\lambda$ increases. The transition between the short-wavelength and long-wavelength limits is illustrated qualitatively in FIG. 12.

Actual scattered-light intensity $I_S$ is approximately proportional to opening density $N_{OP}$ when openings 62 do not significantly overlap. When openings 62 significantly overlap as can arise in the case where the centers of openings 62 are distributed randomly across layer 64 and opening density $N_{OP}$ is high, intensity $I_S$ varies more than linearly with opening density $N_{OP}$. Typically, actual intensity $I_S$ is approximately proportional to $N_{OP}^{1.5}$ for random, high density distribution of the centers of openings 62.

Data processor 108 operates generally in accordance with the relationship shown in FIG. 12 to produce output signal 110 as the desired dimensional information. Because opening diameter $d_{AV}$ is less than principal wavelength value $\lambda_P$, processor 108 specifically operates in accordance with the portion of the curve where ratio $d_{AV}/\lambda$ is less than 1.

Processor 108 can determine the desired information by directly employing the curve of FIG. 12. Density $N_{OP}$ of openings 62 is furnished as an input to processor 108. Using this data and composite signal 106, processor 108 calculates dimensional information 110.

Alternatively, actual scattered-light intensity $I_S$ or data representative of intensity $I_S$ can be determined as a function of opening diameter $d_{AV}$, wavelength, and short-wavelength-limit intensity $I_{SO}$ or data representative of intensity $I_{SO}$ for specimens of object 60 for which diameter $d_{AV}$ is known. This data is then entered into data processor 108 to calibrate it. Opening density $N_{OP}$ is again furnished to processor 108. Other characteristics of object 60, such as layer thicknesses, are also supplied to processor 108 for implementing the calibration. With processor 108 appropriately calibrated, processor 108 processes composite signal 106 to calculate dimensional information 110.

Similar to how the analytical system of FIG. 4 is employed in calculating opening density $N_{OP}$, the analytical system of FIG. 7 or 8 can be utilized in calculating density $N_{OP}$ according to a procedure that also involves short-wavelength light that undergoes scattering as the short wavelength light propagates into openings 62. That is, the short-wavelength scattered light is of wavelength much less than opening diameter $d_{AV}$. Depending on the characteristics of primary light-emitting element 70, the short-wavelength light can be provided by element 70 or another light-emitting element in the light-emitting structure that contains element 70. Similarly, the short-wavelength light can be collected primarily by light-collecting element 72 or by another light-collecting element in the light-collecting structure that contains element 72. The light-collecting element provides data processor 108 with a composite signal representative of the intensity of the collected scattered short-wavelength light.

In this procedure for determining opening density $N_{OP}$, the wavelength for emitted light 76, and thus the wavelength for scattered light 100 or 104, is controlled so as to be close to the long-wavelength limit where ratio $d_{AV}/\lambda$ is much less than 1. By generating composite signal 106 for the long-wavelength light and generating a corresponding composite signal for the short-wavelength light for which ratio $d_{AV}/\lambda$ is much greater than 1, the following approximate equations result:

$$CN_{OP}^z d_{AV}^u = M_C \quad (5)$$

$$DN_{OP}^z d_{AV}^v = M_D \quad (6)$$

where C and D are empirical constants determined from a suitable mathematical analysis or by using reference specimens of object 60 for which density $N_{OP}$ and average opening diameter $d_{AV}$ are known, exponent z is a positive number normally equal to or greater than 1, exponents u and v are positive numbers greater than 1, $M_C$ is a measured value representing the intensity of scattered light 100 or 104 at the long-wavelength limit, and $M_D$ is a measured value representing the intensity of the collected scattered short-wavelength light. Exponent u is normally between 3 and 4, typically 3.5. Exponent v is normally between 2 and 3, typically 2.5. When openings 62 do not significantly overlap, exponent z is 1. When the centers of openings 62 are located randomly relative to one another so that significant overlapping of openings 52 occurs, exponent z is determined empirically to be approximately 1.5.

Solving Eqs. 5 and 6 yields the following values for average opening diameter $d_{AV}$ and opening density $N_{OP}$:

$$d_{AV} = \left(\frac{M_C D}{CM_D}\right)^{1/(u-v)} \quad (7)$$

$$N_{OP} = \left(\frac{C}{M_C}\right)^{v/z(u-v)} \left(\frac{M_D}{D}\right)^{u/z(u-v)} \quad (8)$$

Data processor 108 is typically programmed to calculate diameter $d_{AV}$ and density $N_{OP}$ from Eqs. 7 and 8.

Figure 13:
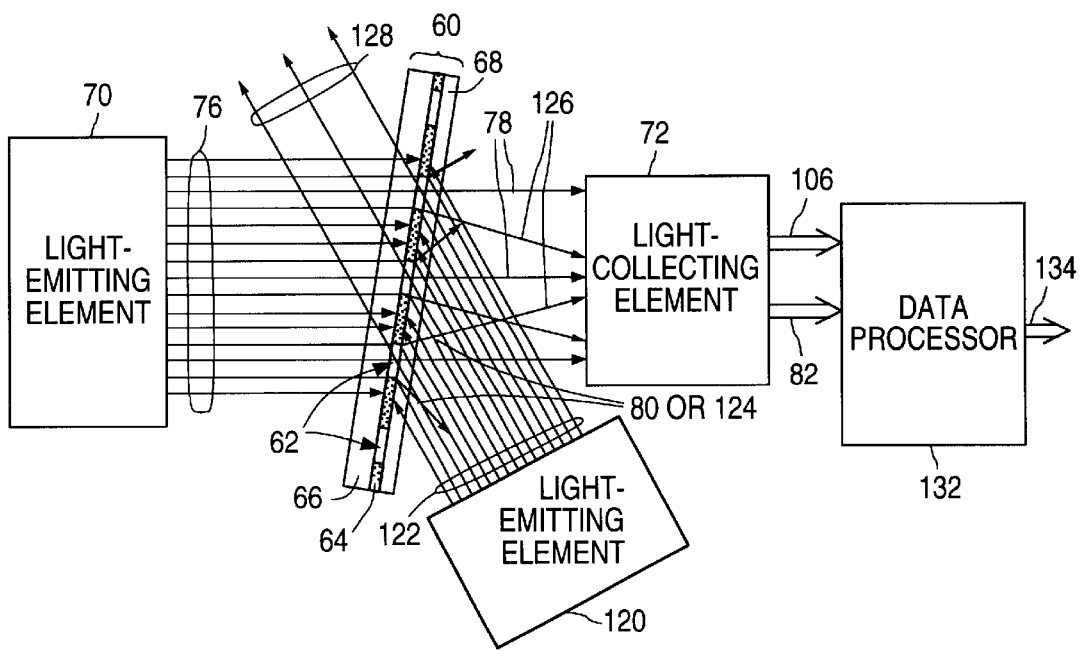
FIG. 13 is a block diagram of an analytical system that uses a combined light-transmission/light-scattering technique in accordance with the invention for determining dimensional information, typically layer thickness, for a perforated layer of an object such as part of a flat-panel CRT display.
Figure 14:
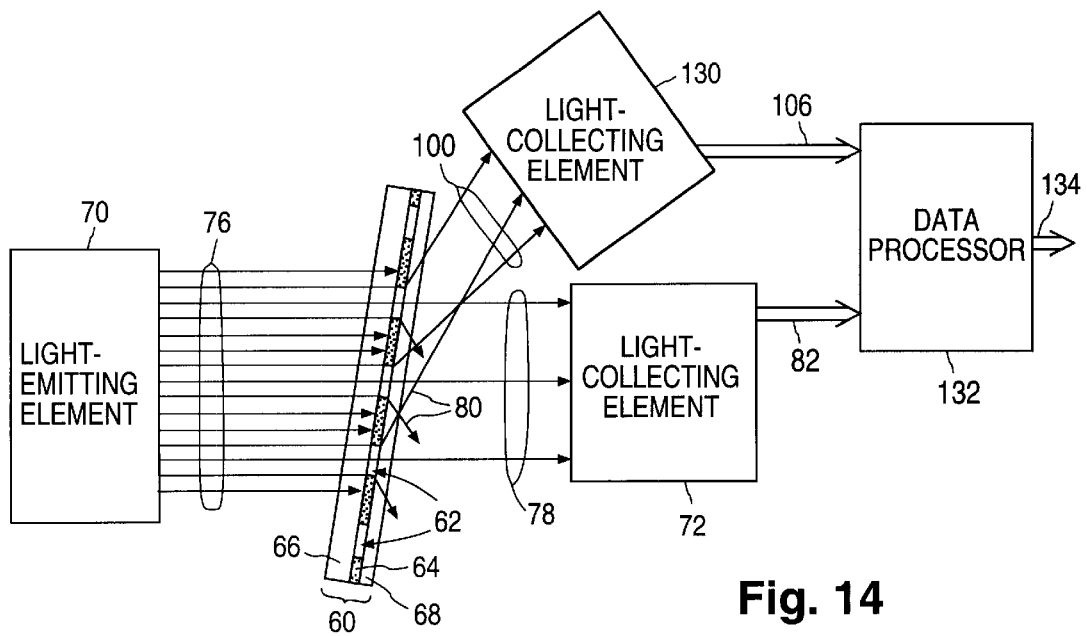
FIG. 14 is a block diagram of another system that uses a combined light-transmission/light-scattering technique in accordance with the invention for determining dimensional information, typically layer thickness, for a perforated layer of an object such as part of a flat-panel CRT display.

Light-transmission/light-scattering Technique for Determining Dimensional Information, Particularly Average Layer Thickness FIGS. 13 and 14 depict a pair of analytical systems that utilize a combined light-transmission/light-scattering technique in accordance with the invention for determining dimensional information about object 60. The dimensional information typically includes the average thickness of perforated layer 64 in object 60. Except for the orientation differences described below, the analytical systems of FIGS. 13 and 14 are configured largely the same and operate in largely the same manner. For convenience, the analytical systems of FIGS. 13 and 14 are described together in the following material.

The light-based analytical system of each of FIGS. 13 and 14 contains a light-emitting structure and a light-collecting structure. During system operation, object 60 and the light-emitting and light-collecting components of the light-emitting and light-collecting structures are situated in a very dark room.

The light-emitting structure in the analytical system in each of FIGS. 13 and 14 contains, at the minimum, primary light-emitting element 70 typically implemented as described above for the analytical system of FIG. 4. Element 70 again emits light 76 that impinges on object 60.

In the analytical system of FIG. 13, the light-emitting structure is illustrated as including a further light-emitting element 120 situated over the opposite side of object 60 from element 70. Light-emitting element 120 emits light that passes through body 68 and impinges on layer 64. Item 122 in FIG. 13 represents part or all of this emitted light depending on the characteristics of element 120 and average diameter $d_{AV}$ of openings 62. Emitted light 122 normally has substantially the same characteristics, including collimation, as emitted light 76. Consequently, emitted light 122 is of wavelength greater than or equal to principal wavelength value $\lambda_P$. Similar to light-emitting element 72, element 120 may emit additional light which passes through body 68 and impinges on layer 64 but which is of wavelength less than $\lambda_P$. Aside from being removed, e.g., filtered out, at some point, the additional low-wavelength light is normally not utilized in the analytical system of FIG. 13.

Light-emitting element 120 may be a separate light-emitting element from light-emitting element 70. If so, element 120 is typically implemented in the manner described above for element 70 in the analytical system of FIG. 4. Alternatively, element 120 may simply be element 70 moved to the location generally indicated for element 120 in FIG. 13.

The light-collecting structure in the analytical system of each of FIGS. 13 and 14 contains, at the minimum, primary light-collecting element 72 typically implemented as described above for the analytical system of FIG. 4. Element 72 collects light 78 transmitted through openings 62 after having been emitted by element 70. In collecting transmitted light 78, element 72 may again be scanned over object 60. Also, portion 80 of emitted light 76 is again scattered backwards and passes back through body 68.

In the analytical system of FIG. 13, a part 124 of emitted light 122 is scattered backwards in being propagated into openings 62. Scattered light 124 then passes back through body 68. Element 72 in FIG. 13 collects a portion 126 of scattered light 124. Element 72 may be scanned over object 60 during the collection of scattered light 126. Although not indicated in FIG. 13, the collection of scattered light 126 is normally performed at different time than the collection of transmitted light 78. Element 72 in FIG. 13 is located so as to avoid receiving light that forms any diffraction patterns resulting from emitted light 122 or/and emitted light 76 impinging on body 60. A part 128 of emitted light 122 is transmitted through openings 62 and through body 66. Transmitted light 128 is not utilized for any purpose here and, accordingly, is not discussed further.

Scattered light 126 forms a light-intensity pattern generally representative of openings 62. Light 126 is of largely the same wavelength as emitted light 122. Since emitted light 122 has largely the same characteristics as emitted light 76, the wavelength of scattered light 126 is normally greater than or equal to primary value $\lambda_P$. Accordingly, average opening diameter $d_{AV}$ is less than, preferably less than one half of, often less than one fourth of, the wavelength of scattered light 126.

In the analytical system of FIG. 14, the light-emitting structure is depicted as including a further light-collecting element 130. The analytical system of FIG. 14 is arranged so that light-collecting elements 130 and 72 are situated over the same side of object 60 but with element 130 out of alignment with light-emitting element 70 through openings 62. Also, element 130 is situated so as to avoid collecting a significant fraction of transmitted light 78. Instead, element 130 collects portion 100 of scattered light 80. In collecting scattered light 100, element 130 may be scanned over object 60.

Light-collecting element 130 may be a separate light-collecting element from light-collecting element 72. If so, element 130 is typically implemented in the manner described above for element 72. The collection of transmitted light 78 and scattered light 100 respectively by elements 72 and 130 can then be performed at the same time or at different times. Alternatively, element 130 may simply be element 72 moved to the location generally indicated for element 130 in FIG. 14. The collection of transmitted light 78 and scattered light 100 is then normally performed at different times.

The light-collecting structure in the analytical system of FIG. 13 or 14 provides composite signals 82 and 106. Composite signal 82 is again representative of the intensity of transmitted light 78. Light-collecting element 72 furnishes both of signals 82 and 106 in the system of FIG. 13. In FIG. 13, signal 106 is representative of the intensity of scattered light 126. Light-collecting elements 72 and 130 respectively provide signals 82 and 106 in the system of FIG. 14. In FIG. 14, signal 106 is representative of the intensity of scattered light 100.

The analytical system of each of FIGS. 13 and 14 contains a data processor 132 that evaluates composite signals 82 and 106 to determine average thickness $t_{AV}$ of layer 64. The thickness information is provided in the form of an output signal 134 generated by processor 132 in response to signals 82 and 106. Processor 132 may be the same physical hardware as processor 74.

Processor output signal 134 is furnished as average layer thickness $t_{AV}$ in generally the following manner. Processor 132 processes composite signal 82 to produce a light-transmission intermediate signal generally analogous to processor output signal 84. Processor 132 similarly processes composite signal 106 to produce a light-scattering intermediate signal generally analogous to processor output signal 110. The processor operations are performed on signals 82 and 106 in a manner similar to how processors 74 and 108 respectively process signals 82 and 106 to generate output signals 84 and 110. Processor 132 then appropriately compares the two intermediate signals to generate output signal 134 as thickness $t_{AV}$.

Processor 132 can determine average layer thickness $t_{AV}$ by directly using curves similar to those of FIGS. 6 and 12. Alternatively, processor 132 can be calibrated using data measured on samples of objects 60 for which thickness $t_{AV}$ is known. With processor 132 appropriately calibrated, processor 132 then calculates output signal 134 as thickness $t_{AV}$. Opening density $N_{OP}$ is typically furnished to processor 132 for making the $t_{AV}$ calculation.

The analytical system of FIG. 13 or 14 contains all the components needed in the analytical system of FIG. 4 for determining average opening diameter $d_{AV}$ according to the light-transmission-based principles of the invention. The system of FIG. 13 also contains all the components needed in the analytical system of FIG. 8 for determining diameter $d_{AV}$ according to the light-scattering-based principles of the invention. Similarly, the system of FIG. 14 contains all the components needed in the analytical system of FIG. 7 for determining diameter $d_{AV}$ according to the invention's light-scattering-based principles. With suitable adjustment of the programming of data processor 132, the system of FIG. 13 or 14 can therefore be utilized to determine diameter $d_{AV}$ according to the invention's light-transmission-based or light-scattering-based principles.

Light-diffraction Technique for Determining Characteristics, Particularly Location of Abnormalities Such as Defects The present invention furnishes a technique in which light diffraction is utilized to determine certain characteristics of lines in which one group of the lines crosses over or under another group of the lines. The characteristics determined according to this light-diffraction-based technique typically include information on the location of abnormalities such as defects. In particular, when a dimension-change abnormality occurs in the upper group of lines or in the lower group of lines so as to be reflected in the upper group of lines, the present diffraction-based technique can be utilized to determine whether the defect is present solely in the upper group of lines or is present in both groups of lines. When a dimension-change abnormality occurs in the lower group of lines in a manner so as not to be significantly reflected in the upper group of lines, the diffraction-based technique of the invention can also be employed to determine that the defect is present solely in the lower group of lines. Additionally, the present technique can be used to at least partially ascertain the general lateral location of the defect.

Figure 15:
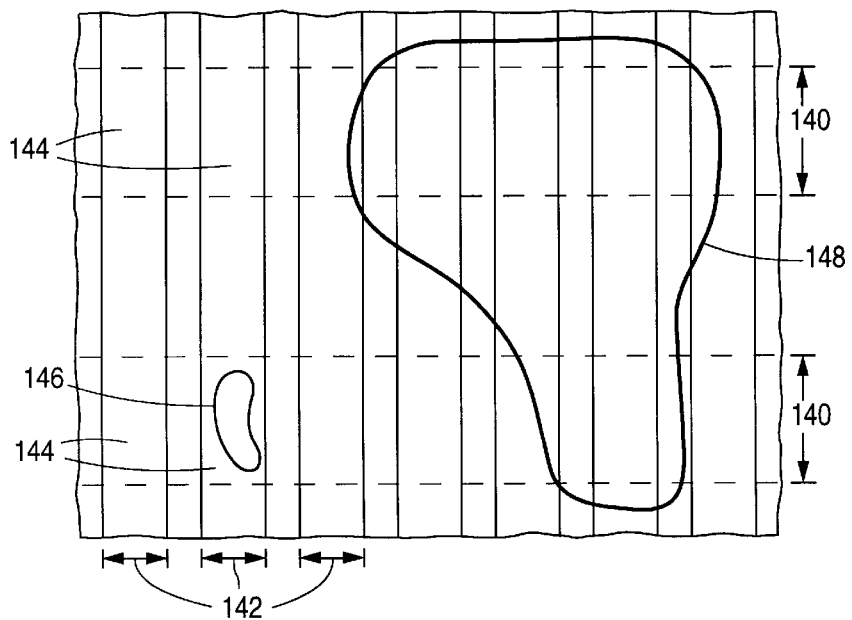
FIG. 15 is a simplified layout view of an abnormality-containing portion of an object such as the electron-emitting device in FIG. 2f.

FIG. 15 illustrates an example of a double-lined structure, i.e., a structure having two groups of crossing lines, that can be examined according to the present diffraction-based technique. The double-lined structure in FIG. 15 is a portion of an object such as field emitter 10 in FIG. 2f. The object in FIG. 15 contains a group of generally parallel lower lines 140 and a group of generally parallel upper lines 142 that cross over, and extend generally perpendicular to, lower lines 140. A layer, not shown, typically separates upper lines 142 from lower lines 140. In view of this, lower lines 140 are depicted in dashed line in FIG. 15. The layer separating lines 142 from lines 140 is typically transparent or transmits sufficient light to enable the present diffraction-based technique to be performed in the manner described below.

Lines 140 and 142 normally overlie a substructure (not shown) having a relatively flat upper surface. Lower lines 140 are typically situated at a relatively uniform distance above the upper surface of the substructure. Upper lines 142 are typically situated at a relatively uniform, and greater, distance above the substructure's upper surface.

Lines 140 and 142 normally consist of electrically non-insulating material, typically electrically conductive material, and are normally opaque. As an example, lines 140 and 142 are normally formed with metal so as to be opaque. The material separating upper lines 142 from lower lines 140 is then typically dielectric material. Nevertheless, lines 140 and 142 can consist of electrically insulating material or/and can be transparent. Although the longitudinal edges of lower lines 140 are depicted as being largely straight in FIG. 15, the longitudinal edges of lines 140 can be curved in various ways. The same applies to upper lines 142.

Items 144 in FIG. 15 indicate the areas where upper lines 142 cross over lower lines 140. Items 146 and 148 qualitatively indicate the locations of two abnormalities, such as defects, which occur at least partially in one or more of lines 140 and 142. Abnormality 146, a small abnormality, is present at only one of crossover areas 144. Abnormality 148, a large abnormality, extends over several crossover areas 144. Abnormalities 146 and 148 are termed crossover abnormalities because each of them is at least partially present at one or more of crossover areas 144. The object in FIG. 15 may also have one or more abnormalities, referred to as non-crossover abnormalities, which occur at least partially in one or more of lines 140 and 142 at locations where none of upper lines 142 crosses over any of lower lines 140.

The crossover and non-crossover abnormalities are typically manifested in the form of abnormal changes in dimension along the intended locations of certain of lines 140 and 142. For instance, each of the crossover and non-crossover abnormalities can be an abnormal change in height, such as a low spot or a high spot, along the intended location of one or more of lines 140 and 142. A low spot that forms such an abnormality can be a gap in one or more of lines 140 and 142. When lines 140 and 142 consist of electrical non-insulating material and the gap causes the electrical resistance to be quite high, this type of abnormality is an open-circuit defect. A low-spot abnormality can cause the electrical resistance to be quite high even though an open-circuit defect is not formed.

Each crossover or non-crossover abnormality can also be an abnormal change in the lateral contour of one or more of lines 140 and 142. Examples include bridges and "mouse bites". An abnormally narrow portion of one of lines 140 and 142 can cause the electrical resistance to be quite high.

Each crossover abnormality, such as abnormality 146 or 148, may be present along the intended location of one or more of upper lines 142 but not significantly present along the intended location of any of lower lines 140. As an example, a low spot along the intended location of one or more of upper lines 142 can be a crossover abnormality which arises from material of that line 142 or those lines 142 dropping downward to contact one or more of lower lines 140 through one or more openings in the material that nominally separates upper lines 142 from lower lines 140. When lines 140 and 142 consist of electrically non-insulating material, this type of crossover abnormality is a short-circuit defect. Each crossover abnormality may also be present along the intended location of one or more of lower lines 140 to such a degree that the effect of the crossover abnormality e.g., change in height, is sufficiently great to be reflected in one or more of upper lines 142.

When the object in FIG. 15 is field emitter 10 of FIG. 2f, lower lines 140 are typically the emitter electrodes in lower non-insulating region 30. The emitter electrodes are expressly shown in FIG. 3 as items 30E. Upper lines 142 in FIG. 15 are typically composite control electrodes 34/38B in FIGS. 2f and 3. Each crossover area 144 laterally circumscribes a corresponding control aperture 36 that laterally bounds a group of electron-emissive elements 48.

The object of FIG. 15 is placed in a dark, preferably very dark, room. Using a light-emitting structure containing one or more light-emitting elements such as light-emitting element 70, one or more light-diffraction patterns characteristic of lower lines 140 and one or more light-diffraction patterns characteristic of upper lines 142 are generated. The region or regions where the diffraction patterns appear may include some scattered light.

The order in which the light-diffraction patterns are produced is immaterial. Consider the simple case in which only one light-diffraction pattern is generated for lower lines 140 and in which only one light-diffraction pattern is generated for upper lines 142. Also assume that the diffraction pattern for lower lines 140 is generated before generating the diffraction pattern for upper lines 142.

Light from the light-emitting structure is directed towards the object of FIG. 15 from a suitable position above the object i.e., above lines 140 and 142 and the underlying substructure. The light passes to the sides of upper lines 142, is transmitted significantly through the layer separating upper lines 142 from lower lines 140, and is diffracted off lower lines 140 to produce a first light-diffraction pattern characteristic of lower lines 140. The light for the first diffraction pattern typically impinges roughly perpendicularly on lower lines 140 at an acute angle, i.e., an angle between 0° and 90°, relative to a plane extending generally parallel to lines 140 and thus generally perpendicular to the upper surface of the underlying substructure.

Light from the light-emitting structure is subsequently directed towards upper lines 142 from a suitable position above the object of FIG. 15 so that the light diffracts off upper lines 142 to produce a second light-diffraction pattern characteristic of lines 142. The light for the second light-diffraction pattern typically impinges roughly perpendicularly on upper lines 142 at an acute angle relative to a plane extending generally parallel to lines 142 and thus generally parallel to the substructure's upper surface. The two positions from which the light impinges on lines 140 and 142 normally differ and are preferably chosen to make the diffraction patterns clear.

Figure 16:
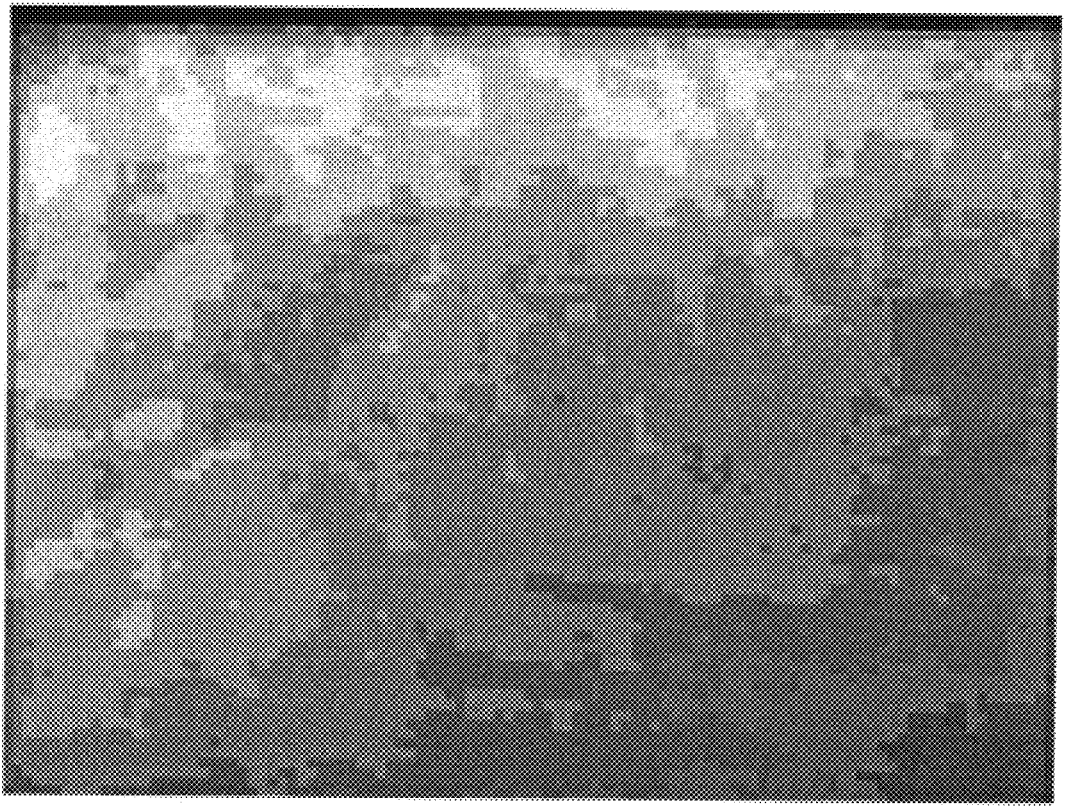
FIG. 16 is a view of a diffraction pattern produced by an object, such as the electron-emitting device of FIG. 2f, having one or more line abnormalities.

Each of the light-diffraction patterns appears in a band of the region above the object of FIG. 15. The light utilized to generate the diffraction patterns is typically visible light. Because the object of FIG. 15 is located in a dark room when the diffraction patterns are generated, the diffraction patterns can readily be seen with the human eye. FIG. 16 illustrates an example of how one such diffraction pattern appears when one or more abnormalities occur in lines 140 and 142 and when the object in FIG. 15 is electron-emitting device 10 of FIG. 2f.

The light-diffraction patterns are examined to determined certain characteristics of lines 140 and 142, especially whether any abnormalities are present in lines 140 and 142. Examination of the diffraction patterns can be performed while they are being generated. Alternatively, photographs of the diffraction patterns can be taken so that they can be examined subsequent to being generated. Information representative of the diffraction patterns can be retained using techniques other than photographs. The examination of the diffraction patterns, whether done while they are being generated or afterwards using information representative of the diffraction patterns, can be performed manually, i.e., with the human eye, or/and with suitable analysis equipment.

When no crossover or non-crossover abnormality is present in lower lines 140 and when the object in FIG. 15 is a device such as field emitter 10, lines 140 normally have a highly regular appearance in terms of line height (or thickness), line width, and line-to-line spacing from one line 140 to another line 140 and from one unit of the object to another unit of the object. The same applies to upper lines 142 when no crossover or non-crossover abnormality is present in lines 142 and when the object is a device such as field emitter 10. In the absence of such an abnormality in the object, the light-diffraction patterns for lines 140 and 142 likewise have very regular appearances.

The occurrence of a crossover or non-crossover abnormality in one or more of lower lines 140 causes a perturbation to appear in the light-diffraction pattern for lines 140. The same occurs in the diffraction pattern for upper lines 142 when such an abnormality occurs in one or more of lines 142. Accordingly, examination of the diffraction patterns entails inspecting them to determine whether there is any perturbation from their normal appearance. Each different perturbation typically indicates a crossover or non-crossover abnormality.

When the light-diffraction pattern for lower lines 140 or upper lines 142 has one or more perturbations, the diffraction pattern usually gradually returns to its normal appearance as the distance from each perturbation increases. Aside from situations in which there is a very large amount of perturbation, each pertubated diffraction pattern typically has a region of relatively normal diffraction appearance. By using the region of relatively normal diffraction appearance to correlate a pertubated diffraction pattern to a corresponding non-pertubated baseline light-diffraction pattern, the particular line or lines 140 or 142 having an abnormality corresponding to a perturbation in the diffraction pattern can be determined.

The light-diffraction patterns for lines 140 and 142 are typically compared to determine which particular group or groups of lines 140 and 142 have the abnormality, i.e., whether the abnormality is present in the group of lower lines 140, whether the abnormality is present in the group of upper lines 142, or whether the abnormality is present in both the group of lower lines 140 and the group of upper lines 142. Finding like-located perturbations in the diffraction patterns for both lower lines 140 and upper lines 142 strongly indicates that the abnormality originates in lower lines 140 and is reflected in upper lines 142. In this case, the abnormality is usually a crossover abnormality such as abnormality 146 or 148.

Finding a perturbation in the diffraction pattern for upper lines 142 without finding a significant like-located perturbation in the diffraction pattern for lower lines 140 strongly indicates that the abnormality occurs in one or more of upper lines 142 but not significantly at the same location in lower lines 140. The abnormality may be a crossover or a non-crossover abnormality. Further examination of the object in FIG. 15 or the diffraction pattern for upper lines 142 may be needed to determine whether the abnormality is a crossover or non-crossover abnormality.

A non-crossover abnormality may, as indicated above, occur in one or more of lower lines 140 so as to not be significantly reflected in any of upper lines 142. Finding a perturbation in the diffraction pattern for lower lines 140 without finding a significant like-located perturbation in the diffraction pattern for upper lines 142 strongly indicates that the abnormality occurs in one or more of lines 140 but not significantly at the same location in upper lines 142. The abnormality is likely a non-crossover abnormality since a crossover abnormality is likely to be reflected in one or more of upper lines 142 and thus appear as a perturbation in the diffraction pattern for lines 142.

Abnormalities whose existence and locations are generally determined in accordance with the invention may, as indicated above, be open-circuit defects in lines 140 or/and 142 or short-circuit defects between upper lines 142, on one hand, and lower lines 140, on the other hand. Abnormalities in lines 140 and 142 may also be other types of defects such as regions of unduly small cross-sectional line area.

The present diffraction-based examination technique can be applied to lines 140 and 142 to investigate features other than abnormalities in lines 140 and 142. For a feature that occurs in at least one of lines 140 and 142, the technique can be generally applied to determine the location of the feature and whether the feature occurs in any of lower lines 140 or/and in any of upper lines 142. The appearance of a representation indicative of the feature at the same locations in the diffraction patterns for both of lines 140 and 142 strongly indicates that the feature occurs in one or more of lower lines 140 at one or more crossover locations so as to be reflected in one or more of upper lines 142. The appearance of a representation indicative of the feature in the diffraction pattern for one of the group of lines 140 or 142 but not significantly in the diffraction pattern for the other group of lines 142 or 140 indicates that the feature is present only in the group of lines 140 or 142 whose diffraction pattern displays the representation indicative of the feature.

Variations

Directional terms such as "upper" and "lower" have been employed in describing the present invention to establish a frame of reference by which the reader can more easily understand how the various parts of an object such as an FED fit together. In actual practice, the components of an FED may be situated at orientations different from that implied by the directional terms used here. Inasmuch as directional terms are used for convenience to facilitate the description, the invention encompasses implementations in which the orientations differ from those strictly covered by the directional terms employed here.

While the invention has been described with reference to particular embodiments, this description is solely for the purpose of illustration and is not to be construed as limiting the scope of the invention claimed below. For instance, gate openings can be formed by techniques that do not involve charged-particle tracking. Ludwig et al, U.S. Pat. No. 5,865, 659, discloses how small, typically spherical, particles are employed in creating gate openings in FEDs. The analytical techniques of the invention can be applied to the FED fabrication processes in Ludwig et al.

Field emission includes the phenomenon generally termed surface conduction emission. The field emitter in an FED fabricated with the assistance of the invention can be replaced with an electron emitter that operates according to thermionic emission or photoemission. Rather than using control electrodes to selectively extract electrons from the electron-emissive elements, the electron emitter can be provided with electrodes that selectively collect electrons from electron-emissive elements which continuously emit electrons during display operation.

The analytical techniques of the invention can be applied to devices other than flat-panel CRT displays. In general, the light-transmission and light-scattering techniques of the invention can be utilized to measure the average diameter of various types of openings for which the average diameter is less than the wavelength of the light used in making the measurements. Various modifications and applications may thus be made by those skilled in the art without departing from the true scope and spirit of the invention as defined in the appended claims.

We claim:

1. A system comprising:
   a light-emitting structure;
   a light-collecting structure (a) for collecting light scattered as it propagates into openings in an object after the scattered light has been emitted by the light-emitting structure and (b) for providing a light-collection signal representative of the scattered light's intensity, the scattered light being of wavelength of at least a principal wavelength value, the openings being of average diameter less than the principal wavelength value; and
   a processor for evaluating the light-collection signal to determine dimensional information about the object.

2. A system as in claim 1 wherein the average diameter of the openings is less than one half the principal wavelength value.

3. A system as in claim 1 wherein the dimensional information comprises the average diameter of the openings.

4. A system as in claim 1 wherein the scattered light comprises visible light.

5. A system as in claim 4 wherein the scattered light comprises white light.

6. A system as in claim 4 wherein the scattered light comprises color light.

7. A system as in claim 1 wherein the openings extend only partway through the object.

8. A system as in claim 1 wherein the openings extend substantially fully through a layer of the object.

9. A system as in claim 8 wherein the layer is electrically non-insulating.

10. A system as in claim 8 wherein the layer is electrically insulating.

11. A system as in claim 1 wherein the object is a partially or completely fabricated component of a flat-panel display.

12. A system as in claim 11 wherein the component is an electron-emitting device.

13. A system as in claim 1 wherein the scattered light (a) is emitted by a primary light-emitting element of the light-emitting structure and (b) is collected by a primary light-collecting element of the light-collecting structure.

14. A system as in claim 13 wherein the primary light-emitting and light-collecting elements are both positioned over one of a pair of opposite sides of the object.

15. A system as in claim 13 wherein the primary light-emitting element is positioned over one of a pair of opposite sides of the object, and the primary light-collecting element is positioned over the other of the opposite sides of the object so as to be substantially out of alignment with the primary light-emitting element through the openings.

16. A system as in claim 13 wherein the object has certain features which are distinct from the openings and which, when struck by light from the light-emitting element, produce light-diffraction patterns, the light-collecting element being positioned over the object at a location outside the light-diffraction patterns of these features.

17. A system as in claim 16 wherein the features are lines of largely opaque material.

18. A system as in claim 13 wherein the object and the primary light-collecting element are movable relative to each other.

19. A system as in claim 13 wherein the primary light-collecting element comprises a camera.

20. A system as in claim 1 wherein:
   the light-collecting structure is operable (a) for collecting further light scattered as it propagates into the openings after the further scattered light has been emitted by the light-emitting structure and (b) for providing a further light-collection signal representative of the further scattered light's intensity, the further scattered light being of wavelength less than the principal wavelength value; and
   the processor is operable for evaluating the further light-collection signal to determine density information about the openings.

21. A system as in claim 20 wherein:
   the dimensional information comprises the average diameter of the openings; and
   the density information comprises the average density of the openings.

22. A system comprising:
   a light-emitting structure;
   a light-collecting structure (a) for collecting light transmitted through openings in an object after the transmitted light has been emitted by the light-emitting structure and (b) for providing a light-collection signal representative of the transmitted light's intensity, the transmitted light being of wavelength of at least a principal wavelength value, the openings being of average diameter less than the principal wavelength value; and
   a processor for evaluating the light-collection signal to determine dimensional information about the openings.

23. A system as in claim 22 wherein the average diameter of the openings is less than one half the principal wavelength value.

24. A system as in claim 22 wherein the dimensional information comprises the average diameter of the openings.

25. A system as in claim 22 wherein the transmitted light comprises visible light.

26. A system as in claim 22 wherein the openings extend only partway through the object.

27. A system as in claim 22 wherein non-opaque material of the object extends along the openings.

28. A system as in claim 22 wherein the openings extend substantially fully through a layer of the object.

29. A system as in claim 28 wherein the layer is electrically non-insulating.

30. A system as in claim 29 wherein the layer consists principally of metal.

31. A system as in claim 22 wherein the object is a partially or completely fabricated component of a flat-panel display.

32. A system as in claim 31 wherein the component is an electron-emitting device.

33. A system as in claim 22 wherein the transmitted light (a) is emitted by a primary light-emitting element of the light-emitting structure and (b) is collected by a primary light-collecting element of the light-collecting structure, the primary light-emitting element being positioned over one of a pair of opposite sides of the object, the primary light-collecting element being positioned over the other side of the object so as to be substantially in alignment with the primary light-emitting element through at least part of the openings.

34. A system as in claim 22 wherein:
the light-collecting structure is operable (a) for collecting further light transmitted through the openings after the further transmitted light has been emitted by the light-emitting structure and (b) for providing a further light-collection signal representative of the further transmitted light's intensity, the further transmitted light being of wavelength less than the principal wavelength value; and
the processor is operable for evaluating the further light-collection signal to determine density information about the openings.

35. A system as in claim 34 wherein:
the dimensional information comprises the average diameter of the openings; and
the density information comprises the average density of the openings.

36. A system comprising:
a light-emitting structure;
a light-collecting structure (a) for collecting light transmitted through openings in a layer of an object after the transmitted light has been emitted by the light-emitting structure, (b) for providing a transmitted-light light-collection signal representative of the transmitted light's intensity, (c) for collecting light scattered as it propagates into the openings after the scattered light has been emitted by the light-emitting structure, and (d) for providing a scattered-light light-collection signal representative of the scattered light's intensity, the transmitted and scattered light being of wavelength of at least a principal wavelength value, the openings being of average diameter less than the principal wavelength value; and
a processor for evaluating the light-collection signals to determine the average thickness of the layer.

37. A system as in claim 36 wherein the average diameter of the openings is less than one half than the principal wavelength value.

38. A system as in claim 36 wherein the transmitted and scattered light comprises visible light.

39. A system as in claim 36 wherein the layer is electrically non-insulating.

40. A system as in claim 39 wherein the layer consists principally of metal.

41. A system as in claim 36 wherein the openings extend substantially fully through the layer.

42. A system as in claim 36 wherein the processor determines the average thickness of the layer by a procedure that involves comparing the light-collection signals.

43. A system as in claim 36 wherein the object is a partially or completely finished component of a flat-panel display.

44. A system as in claim 43 wherein the component is an electron-emitting device.

45. A system as in claim 36 wherein the light-emitting and light-collecting structures comprise:
a primary light-emitting element positioned over one of a pair of opposite sides of the object;
a primary light-collecting element positioned over the other side of the object so as to be substantially in alignment with the primary light-emitting element through at least part of the openings; and
at least one of (a) a further light-emitting element positioned over the same side of the object as the primary light-collecting element and (b) a further light-collecting element positioned over the same side of the object as the primary light-collecting element so as to be substantially out of alignment with the primary light-emitting element through the openings.

46. A method comprising the steps of:
directing light towards an object;
collecting light scattered as it propagates into openings in the object where the scattered light is of wavelength of at least a principal wavelength value and where the openings are of average diameter less than the principal wavelength value;
providing a light-collection signal representative of the scattered light's intensity; and
evaluating the light-collection signal to determine dimensional information about the openings.

47. A method as in claim 46 wherein the average diameter of the openings is less than one half the principal wavelength value.

48. A method as in claim 46 wherein the dimensional information comprises the average diameter of the openings.

49. A method as in claim 46 wherein the scattered light comprises visible light.

50. A method as in claim 46 further including, during the directing, collecting, providing, and evaluating steps, the step of forming the openings in the object.

51. A method as in claim 50 further including the step of terminating the forming step when the dimensional information reaches a prescribed value.

52. A method as in claim 46 wherein the collecting step entails scanning a collector of the scattered light over the object.

53. A method comprising the steps of:
directing light towards an object;
collecting light transmitted through openings in the object where the transmitted light is of wavelength of at least a principal wavelength value and where the openings are of average diameter less than the principal wavelength value;
providing a light-collection signal representative of the transmitted light's intensity; and
evaluating the light-collection signal to determine dimensional information about the openings.

54. A method as in claim 53 wherein the average diameter of the openings is less than one half the primary wavelength value.

55. A method as in claim 53 wherein the dimensional information comprises the average diameter of the openings.

56. A method as in claim 53 wherein the transmitted light comprises visible light.

57. A method as in claim 53 further including, during the directing, collecting, providing, and evaluating steps, the step of forming the openings in the object.

58. A method as in claim 57 further including the step of terminating the forming step when the dimensional information reaches a prescribed value.

59. A method as in claim 53 wherein the collecting step entails scanning a collector of the transmitted light over the object.

60. A method comprising the steps of:
directing light towards an object;

collecting (a) light transmitted through openings in a layer of the object and (b) light scattered as it propagates into the openings where the transmitted and scattered light is of wavelength of at least a principal wavelength value and where the openings are of average diameter less than the principal wavelength value;

providing (a) a transmitted-light light-collection signal representative of the transmitted light's intensity and (b) a scattered-light light-collection signal representative of the scattered light's intensity; and evaluating the light-collection signals to determine the average thickness of the layer.

61. A method as in claim 60 wherein the average diameter of the opening is less than one half the primary wavelength value.

62. A method as in claim 60 wherein the transmitted and scattered light comprises visible light.

63. A method as in claim 60 wherein the evaluating step involves comparing the light-collection signals.

64. A method comprising the steps of:

directing light towards an object having a group of generally parallel first lines and a group of generally parallel second lines that cross the first lines such that light (a) diffracts off the first lines to produce a first light-diffraction pattern characteristic of the first lines and (b) diffracts off the second lines to produce a second light-diffraction pattern characteristic of the second lines; and examining the light-diffraction patterns to determine characteristics of the lines.

65. A method as in claim 64 wherein the examining step entails:

generating information representative of the light-diffraction patterns; and examining the information.

66. A method as in claim 64 wherein the first lines overlie a substructure of the object, and the second lines overlie the substructure and cross over the first lines, the light impinging on the lines from above the lines and the substructure.

67. A method as in claim 66 wherein, for a feature that occurs in at least one of the lines, the examining step comprises comparing the light-diffraction patterns to determine whether the feature occurs in any of the first lines and whether the feature occurs in any of the second lines.

68. A method as in claim 67 wherein the feature comprises a defect in the lines.

69. A method as in claim 67 wherein, when the feature occurs where at least one of the second lines crosses over at least one of the first lines, a representation indicative of the feature (a) appears in both light-diffraction patterns when the feature is present in at least one of the first lines and (b) appears in the second light-diffraction pattern but not significantly in the first light-diffraction pattern when the feature is present in at least one of the second lines but is not significantly present in any of the first lines.

70. A method as in claim 67 wherein, when the feature occurs largely where none of the second lines crosses over any of the first lines, a representation indicative of the feature appears (a) in the first light-diffraction pattern but not significantly in the second light-diffraction pattern when the feature is present in at least one of the second lines but is not significantly present in any of the first lines and (b) appears in the second light-diffraction pattern but not significantly in the first light-diffraction pattern when the feature is present in at least one of the second lines but is not significantly present in any of the first lines.

71. A method as in claim 66 wherein, for a feature that occurs in at least one of the lines, the examining step comprises determining each line having the feature.

72. A method as in claim 71 wherein, the feature comprises a defect in the lines.

73. A method as in claim 64 wherein the light comprises visible light.

74. A method as in claim 64 wherein the object is a partially or completely fabricated component of a flat-panel display.

\* \* \* \* \*